United States Patent
Miyazaki et al.

(10) Patent No.: US 10,615,348 B2
(45) Date of Patent: Apr. 7, 2020

(54) ORGANIC LIGHT-EMITTING DEVICE

(71) Applicants: Samsung Electronics Co., Ltd., Suwon-si, Gyeonggi-do (KR); Samsung SDI Co., Ltd., Yongin-si, Gyeonggi-do (KR)

(72) Inventors: Hiroshi Miyazaki, Suwon-si (KR); Hosuk Kang, Suwon-si (KR); Masaki Numata, Suwon-si (KR); Sooghang Ihn, Hwaseong-si (KR); Soonok Jeon, Seoul (KR); Miyoung Chae, Suwon-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 411 days.

(21) Appl. No.: 15/091,172

(22) Filed: Apr. 5, 2016

(65) Prior Publication Data
US 2017/0141323 A1 May 18, 2017

(30) Foreign Application Priority Data
Nov. 16, 2015 (KR) .................. 10-2015-0160454

(51) Int. Cl.
*H01L 51/00* (2006.01)
*H01L 51/50* (2006.01)
(Continued)

(52) U.S. Cl.
CPC ........ *H01L 51/0067* (2013.01); *C09K 11/025* (2013.01); *C09K 11/06* (2013.01);
(Continued)

(58) Field of Classification Search
CPC ................ H01L 51/0067; C09K 11/06; C09K 2211/1059
See application file for complete search history.

(56) References Cited

U.S. PATENT DOCUMENTS 8,415,032 B2 * 4/2013 Takada ............... C07F 15/0033
252/301.16
2010/0171418 A1 * 7/2010 Kinoshita ............. C09K 11/06
313/504
(Continued)

FOREIGN PATENT DOCUMENTS

JP  4729641 B2  4/2011
JP  2011-256143 A  12/2011
(Continued)

OTHER PUBLICATIONS

Machine Translation of WO 2013175747 A1 (Year: 2013).*
(Continued)

*Primary Examiner* — Michael M Dollinger
(74) *Attorney, Agent, or Firm* — Cantor Colburn LLP

(57) ABSTRACT

An organic light-emitting device including a first electrode, a second electrode facing the first electrode, and an organic layer disposed between the first electrode and the second electrode, wherein the organic layer includes an emission layer, the emission layer includes a host and a fluorescent dopant, the organic light-emitting device satisfies Equation 1, the host includes a compound represented by Formulae 1, 2, or 3, and the fluorescent dopant satisfies Equation 2, wherein Formulae 1-3 and Equations 1-2 are the same as described in the specification.

2 Claims, 1 Drawing Sheet

(51) Int. Cl.
*C09K 11/02* (2006.01)
*C09K 11/06* (2006.01)
(52) U.S. Cl.
CPC ...... *H01L 51/0072* (2013.01); *H01L 51/5004* (2013.01); *C09K 2211/1007* (2013.01); *C09K 2211/1029* (2013.01); *C09K 2211/1059* (2013.01); *H01L 51/5012* (2013.01); *H01L 2251/552* (2013.01)

(56) References Cited

U.S. PATENT DOCUMENTS

| | | | | |
|---|---|---|---|---|
| 2011/0084258 | A1* | 4/2011 | Kim | H01L 51/5048 257/40 |
| 2011/0193074 | A1* | 8/2011 | Lee | C07D 209/82 257/40 |
| 2012/0119197 | A1* | 5/2012 | Nishimura | C07D 209/86 257/40 |
| 2012/0153273 | A1* | 6/2012 | Takada | C07F 15/0033 257/40 |
| 2012/0241732 | A1* | 9/2012 | Endo | C09B 57/00 257/40 |
| 2013/0285035 | A1 | 10/2013 | Taka et al. | |
| 2015/0090964 | A1* | 4/2015 | Hwang | H01L 51/0058 257/40 |
| 2015/0141642 | A1 | 5/2015 | Adachi et al. | |
| 2015/0166886 | A1 | 6/2015 | Endo et al. | |
| 2015/0380662 | A1* | 12/2015 | Kim | H01L 51/0072 257/40 |

FOREIGN PATENT DOCUMENTS

| | | |
|---|---|---|
| KR | 2011-0088457 A | 8/2011 |
| KR | 2012-0112517 A | 10/2012 |
| KR | 2013-0074816 A | 7/2013 |
| KR | 2014-0132244 A | 11/2014 |
| KR | 2014-0133405 A | 11/2014 |
| KR | 2015-0059324 A | 6/2015 |
| WO | 2011-024733 A1 | 3/2011 |
| WO | 2012-005269 A1 | 1/2012 |
| WO | 2012-096241 A1 | 7/2012 |
| WO | 2013-161437 A1 | 10/2013 |
| WO | WO-2013175747 A1 * | 11/2013 ............. C09K 11/06 |
| WO | 2015-022974 A1 | 2/2015 |

OTHER PUBLICATIONS

Online Publication of Cho. Adv. Mater. 2014, 26, 4050-4055. Available at https://onlinelibrary.wiley.com/doi/full/10.1002/adma.201400347. (Year: 2014).*

Hajime Nakanotani et al. "Promising operational stability of high-efficiency organic light-emitting diodes based on hermally activated delayed fluorescence", Scientific Reports, 3, 2127 (2013).

Keigo Sato et al. "Organic Luminescent Molecule with Energetically Equivalent Singlet and Triplet Excited States for Organic Light-Emitting Diodes", Physical Review Letters, 110, 247401 (2013).

Lijun Deng et al. "Simple bipolar host materials incorporating CN group for highly efficient blue electrophosphorescence with slow efficiency roll-off", Journal of Materials Chemistry C: Materials for Optical and Electronic Devices (2013), 1(48), 8140-8145.

Qi Wang et al. "Exciton-Polaron-Induced Aggregation of Wide-Bandgam Materials and its Implication on the Electroluminescence Stability of Phosphorescent Organic Light-Emitting Devices", Adv. Funct. Mater., 24, 2975 (2014).

Yong Joo Cho et al. "A Universal Host Material for High External Quantum Efficiency Close to 25% and Long Lifetime in Green Fluorescent and Phosphorescent OLEDs", Advanced Materials (2014), 26(24), 4050-4055.

* cited by examiner

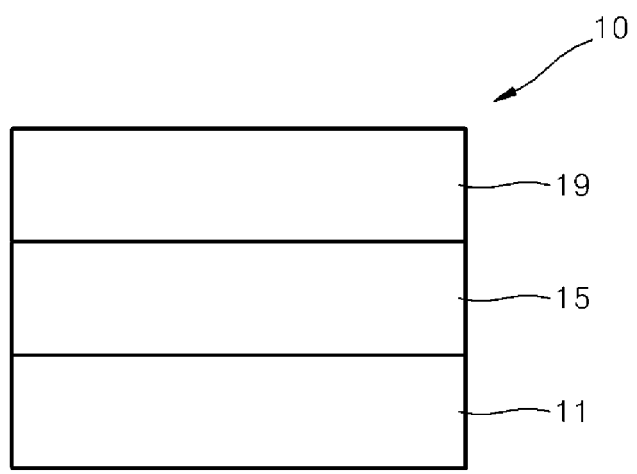

ORGANIC LIGHT-EMITTING DEVICE

CROSS-REFERENCE TO RELATED APPLICATION

This application claims priority to and the benefit of Korean Patent Application No. 10-2015-0160454, filed on Nov. 16, 2015, in the Korean Intellectual Property Office, the content of which is incorporated herein in its entirety by reference.

BACKGROUND

1. Field

The present disclosure relates to an organic light-emitting device.

2. Description of the Related Art

Organic light emitting devices (OLEDs) are self-emission devices that have wide viewing angles, high contrast ratios, and short response times. In addition, OLEDs exhibit excellent brightness, driving voltage, and response speed characteristics, compared to devices in the art, and produce full-color images.

A typical organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transition from an excited state to a ground state, thereby generating light.

Various types of organic light emitting devices are known. However, there still remains a need in OLEDs having low driving voltage, high efficiency, high brightness, and long lifespan.

SUMMARY

Provided are organic light-emitting devices having high efficiency and a long lifespan.

Additional aspects will be set forth in part in the description which follows and, in part, will be apparent from the description, or may be learned by practice of the presented embodiments.

According to an aspect of an embodiment, an organic light-emitting device includes:

a first electrode, a second electrode facing the first electrode, and an organic layer disposed between the first electrode and the second electrode, wherein the organic layer may include an emission layer, the emission layer may include a host and a fluorescent dopant, the organic light-emitting device satisfies Equation 1, the host may include a compound represented by Formulae 1, 2 or 3, and the fluorescent dopant satisfies Equation 2:

$$0.2 \text{ electron Volts} \leq E_{T1}(H) - E_{T1}(FD) \leq 0.5 \text{ electron Volts} \quad \text{Equation 1}$$

$$0 \text{ electron Volts} \leq E_{S1}(FD) - E_{T1}(FD) \leq 0.2 \text{ electron Volts} \quad \text{Equation 2}$$

in Equations 1 and 2

$E_{T1}(H)$ indicates a triplet energy level of the host expressed in electron Volts, $E_{T1}(FD)$ indicates a triplet energy level of the fluorescent dopant expressed in electron Volts, $E_{S1}(FD)$ indicates a singlet energy level of the fluorescent dopant expressed in electron Volts, and $E_{T1}(H)$, $E_{T1}(FD)$, and $E_{S1}(FD)$ are evaluated by using a Density Functional Theory method of Gaussian program that is structurally optimized at a level of B3LYP/6-31G(d, p):

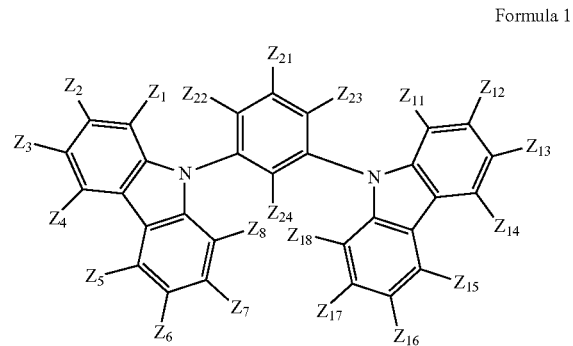

Formula 1

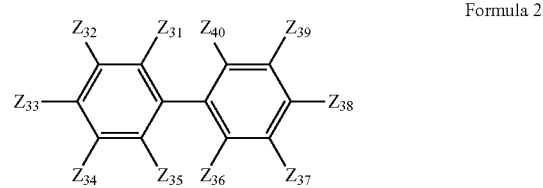

Formula 2

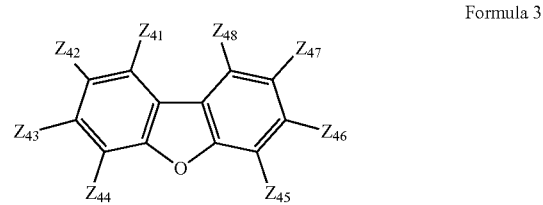

Formula 3

Formula 2A

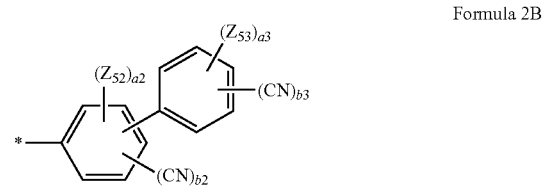

Formula 2B

-continued

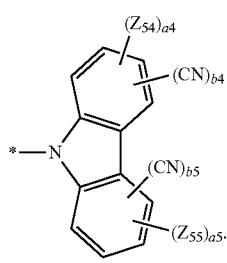

Formula 2C $Z_1$ to $Z_8$ and $Z_{11}$ to $Z_{18}$ in Formula 1 may each independently be selected from hydrogen, deuterium, and a cyano group (CN), $Z_{21}$ to $Z_{24}$ in Formula 1 may each independently be selected from hydrogen, deuterium, a cyano group, a group represented by Formula 2A, and a group represented by Formula 2B, $Z_{31}$ to $Z_{40}$ in Formula 2 and $Z_{41}$ to $Z_{48}$ in Formula 3 may each independently be selected from hydrogen, deuterium, a cyano group and a group represented by Formula 2C, two or more selected from $Z_{31}$ to $Z_{40}$ in Formula 2 and two or more selected from $Z_{41}$ to $Z_{48}$ in Formula 3 may each independently the group represented by Formula 2C, $Z_{51}$ to $R_{55}$ in Formulae 2A to 2C may each independently be hydrogen or deuterium, a1 to a5 in Formulae 2A to 2C may each independently be an integer selected from 0 to 4, b1 in Formula 2A may be an integer selected from 1 to 5, b2 to b5 in Formulae 2B and 2C may each independently be an integer selected from 0 to 4, provided that the sum of b2 and b3 is 1 or more,

* in Formulae 2A to 2C indicates a binding site to a neighboring atom, and a compound represented by Formula 1, a compound represented by Formula 2, and a compound represented by Formula 3 may each independently include at least one cyano group.

BRIEF DESCRIPTION OF THE DRAWING

These and/or other aspects will become apparent and more readily appreciated from the following description of the embodiments, taken in conjunction with FIG. 1, which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organic light-emitting device according to an embodiment includes a first electrode, a second electrode facing the first electrode, and an organic layer disposed between the first electrode and the second electrode, wherein the organic layer includes an emission layer, wherein the emission layer includes a host and a fluorescent dopant.

In various embodiments, the host may be a compound represented by Formula 1, 2, or 3, and the emission layer may consist of the host and the fluorescent dopant.

The organic light-emitting device may satisfy Equation 1:

$$0.2 \text{ electron Volts} \leq E_{T1}(H) - E_{T1}(FD) \leq 0.5 \text{ electron Volts}.$$ Equation 1

In Equation 1, $E_{T1}$ (H) indicates a triplet energy level of the host expressed in electron Volts (eV), $E_{T1}$(FD) indicates a triplet energy level of the fluorescent dopant expressed in electron Volts (eV), $E_{T1}$(H) and $E_{T1}$(FD) are evaluated by using a Density Functional Theory (DFT) method of Gaussian program which is structurally optimized at a level of B3LYP/6-31G (d,p).

Since the organic light-emitting device satisfies Equation 1, the leakage of energy from triplet excitons, generated by the fluorescent dopant, toward to the host in the emission layer may be prevented, thereby efficiently performing an emission process. Moreover, an activation excitation energy level of a host material is suppressed, thereby enabling the manufacture of an organic light-emitting device having a long lifespan.

The host may include the compound represented by Formulae 1, 2, or 3.

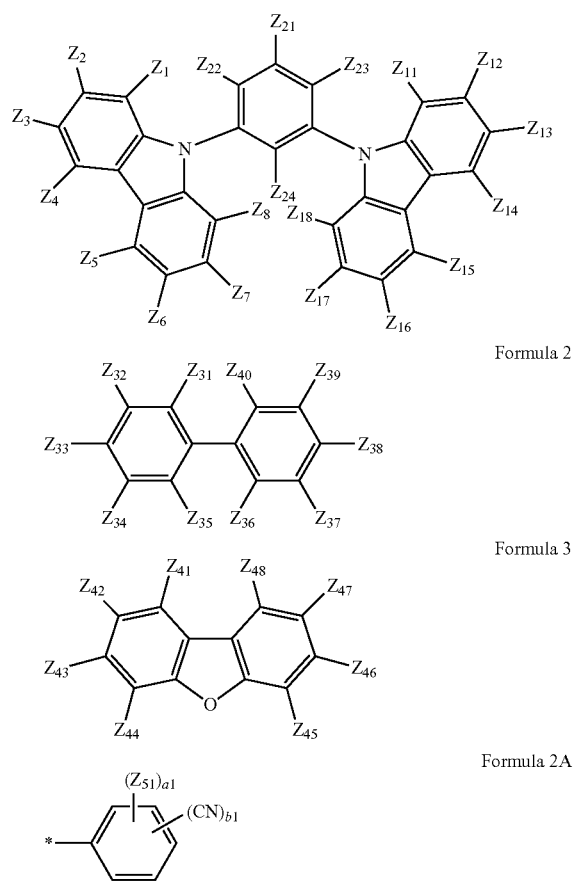

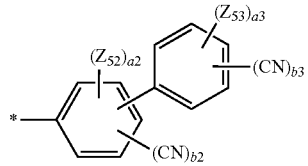

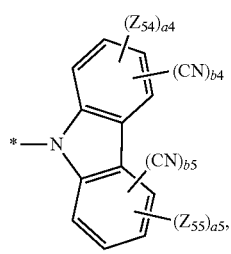

$Z_1$ to $Z_8$ and $Z_{11}$ to $Z_{18}$ in Formula 1 may each independently be selected from hydrogen, deuterium, and a cyano group (CN), and $Z_{21}$ to $Z_{24}$ may each independently be selected from hydrogen, deuterium, a cyano group, a group represented by Formula 2A, and a group represented by Formula 2B.

$Z_{31}$ to $Z_{40}$ in Formula 2 and $Z_{41}$ to $Z_{48}$ in Formula 3 may each independently be selected from hydrogen, deuterium, a cyano group, and a group represented by Formula 2C, and two or more selected from $Z_{31}$ to $Z_{40}$ in Formula 2 and two or more selected from $Z_{41}$ to $Z_{48}$ in Formula 3 may each independently be a group represented by Formula 2C.

$Z_{51}$ to $R_{55}$ in Formulae 2A to 2C may each independently be hydrogen or deuterium, and a1 to a5 may each independently be an integer selected from 0 to 4. a1 to a5 may each indicate the number of groups $Z_{51}$ to $Z_{55}$, and for example, a1 to a5 may be each independently be 0, 1, or 2, but a1 to a5 are not limited thereto.

b1 in Formula 2A may be an integer selected from 1 to 5. For example, b1 may be 1, 2, or 3, and for example, 1 or 2. However, b1 is not limited thereto.

b2 to b5 in Formulae 2B and 2C may each independently be an integer selected from 0 to 4, provided that the sum of b2 and b3 is 1 or more. For example, Formula 2B necessarily include at least one cyano group. b2 to b5 may each independently be 0, 1, or 2, but are not limited thereto.

* in Formulae 2A to 2C indicates a binding site to a neighboring atom.

In various embodiments, $Z_3$, $Z_6$, $Z_{13}$, and $Z_{16}$ in Formula 1 may all be hydrogen, or at least one selected from $Z_3$, $Z_6$, $Z_{13}$, and $Z_{16}$ may be a cyano group. For example, $Z_3$, $Z_6$, $Z_{13}$, and $Z_{16}$ in Formula 1 may all be hydrogen, or one or two selected from $Z_3$, $Z_6$, $Z_{13}$, and $Z_{16}$ may be a cyano group. However, $Z_3$, $Z_6$, $Z_{13}$, and $Z_{16}$ are not limited thereto.

In various embodiments, b1 in Formula 2A may be 1 or 3, b2 in Formula 2B may be 0 or 1, and b3 may be 1, 2, or 3. In various embodiments, b1 in Formula 2A may be 1, b2 in Formula 2B may be 0, and b3 may be 1 or 2. However, b1, b2, and b3 are not limited thereto.

In various embodiments, $Z_{21}$ in Formula 1 may be hydrogen, or a group represented by one formula selected from Formulae 2A-1 to 2A-10, and 2B-1 to 2B-15:

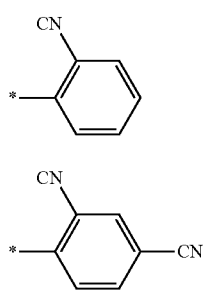
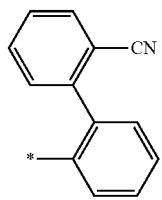
Formula 2A-1
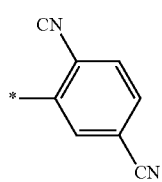
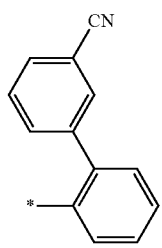
Formula 2A-2
Formula 2A-3
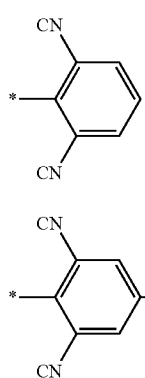
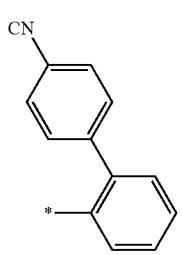
Formula 2A-4
Formula 2A-5
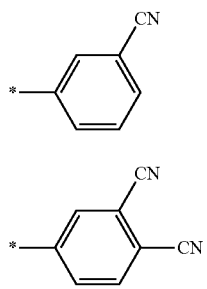
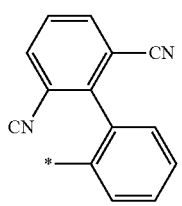
Formula 2A-6
Formula 2A-7
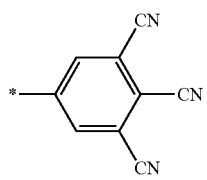
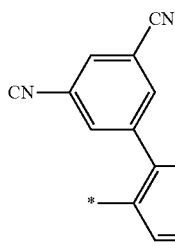
Formula 2A-8
Formula 2A-9
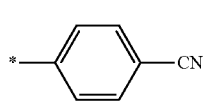
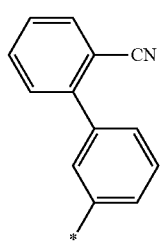
Formula 2A-10
Formula 2B-1
Formula 2B-2
Formula 2B-3
Formula 2B-4
Formula 2B-5
Formula 2B-6

-continued

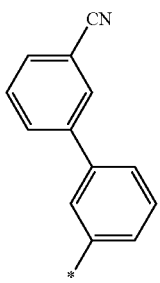
Formula 2B-7

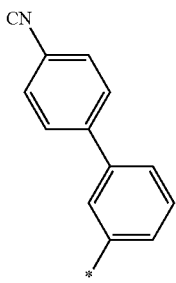
Formula 2B-8

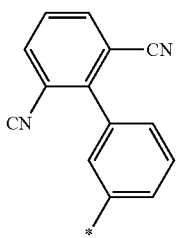
Formula 2B-9

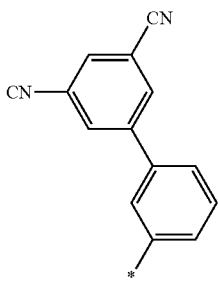
Formula 2B-10

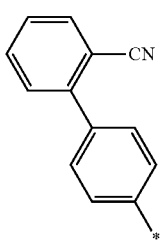
Formula 2B-11

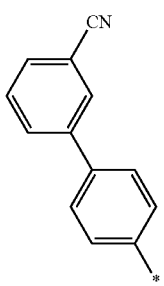
Formula 2B-12

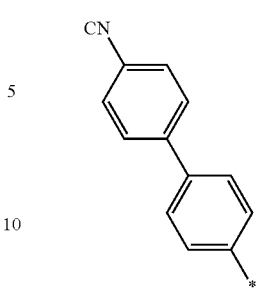
Formula 2B-13

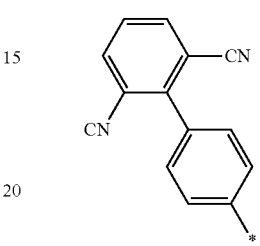
Formula 2B-14

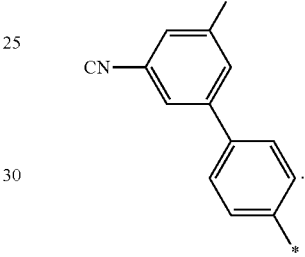
Formula 2B-15

* in Formulae 2A-1 to 2A-10 and 2B-1 to 2B-15 indicates a binding site to a neighboring atom.

In various embodiments, in Formula 2, i) one selected from $Z_{34}$ and $Z_{35}$ and ii) one selected from $Z_{39}$ and $Z_{40}$ may each independently be a group represented by Formula 2C, for example, a group represented by one of Formulae 2C-1 to 2C-3.

In various embodiments, in Formula 3, i) one selected from $Z_{41}$ and $Z_{42}$ and ii) one selected from $Z_{47}$ and $Z_{48}$ may each independently be a group represented by Formula 2C, for example, a group represented by one of Formulae 2C-1 to 2C-3.

In various embodiments, $Z_{31}$ to $Z_{40}$ in Formula 2 and $Z_{41}$ to $Z_{48}$ in Formula 3 may each independently be selected from hydrogen, deuterium, a cyano group, and a group represented by Formulae 2C-1 to 2C-3, and two or more selected from $Z_{31}$ to $Z_{40}$ in Formula 2 and two or more selected from $Z_{41}$ to $Z_{48}$ in Formula 3 may each independently be selected from groups represented by Formulae 2C-1 to 2C-3:

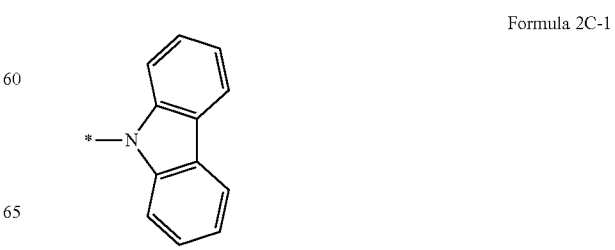
Formula 2C-1

Formula 2C-2

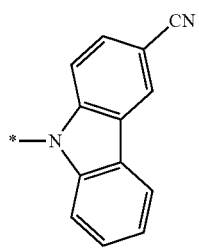

Formula 2C-3

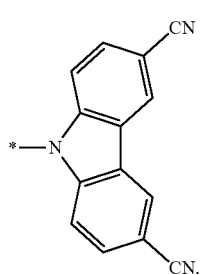

* in Formulae 2C-1 to 2C-3 indicates a binding site to a neighboring atom.

In various embodiments, the host may include a compound represented by Formulae 1-1, 2-1, or 3-1:

Formula 1-1

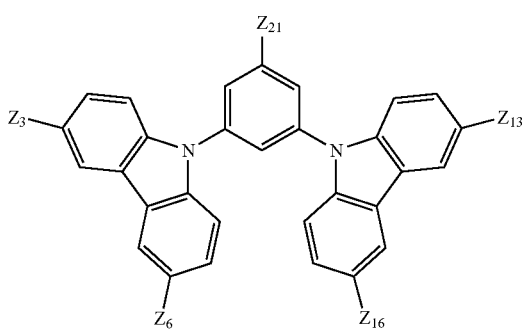

Formula 2-1

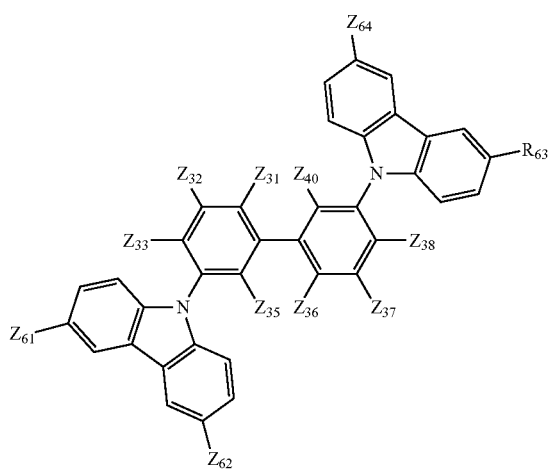

Formula 3-1

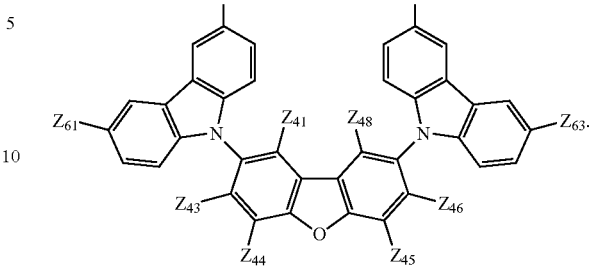

In Formula 1-1, $Z_3$, $Z_6$, $Z_{13}$, and $Z_{16}$ may each independently be hydrogen, deuterium, or a cyano group, and $Z_{21}$ may be selected from hydrogen, deuterium, a cyano group, and a group represented by one formula of Formulae 2A-1 to 2A-10 and 2B-1 to 2B-15.

$Z_{31}$ to $Z_{33}$, $Z_{35}$ to $Z_{40}$ and $Z_{61}$ to $Z_{64}$ in Formula 2-1 may each independently be hydrogen, deuterium, or a cyano group.

$Z_{41}$, $Z_{43}$ to $Z_{46}$, $Z_{48}$ and $Z_{61}$ to $Z_{64}$ in Formula 3-1 may each independently be hydrogen, deuterium, or a cyano group.

In various embodiments, at least one selected from $Z_3$, $Z_6$, $Z_{13}$, and $Z_{16}$ in Formula 1-1 may be a cyano group;

$Z_{21}$ in Formula 1-1 may be selected from groups represented by Formulae 2A-1 to 2A-10 and 2B-1 to 2B-15; or at least one selected from $Z_{61}$ to $Z_{64}$ in Formulae 2-1 and 3-1 may be a cyano group, but is not limited thereto.

In various embodiments, the host may be one selected from Compounds H1 to H14, but is not limited thereto:

H1

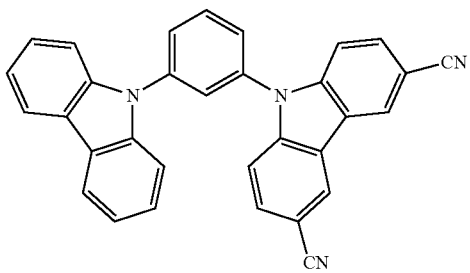

H2

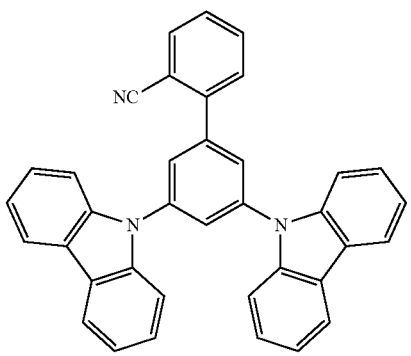

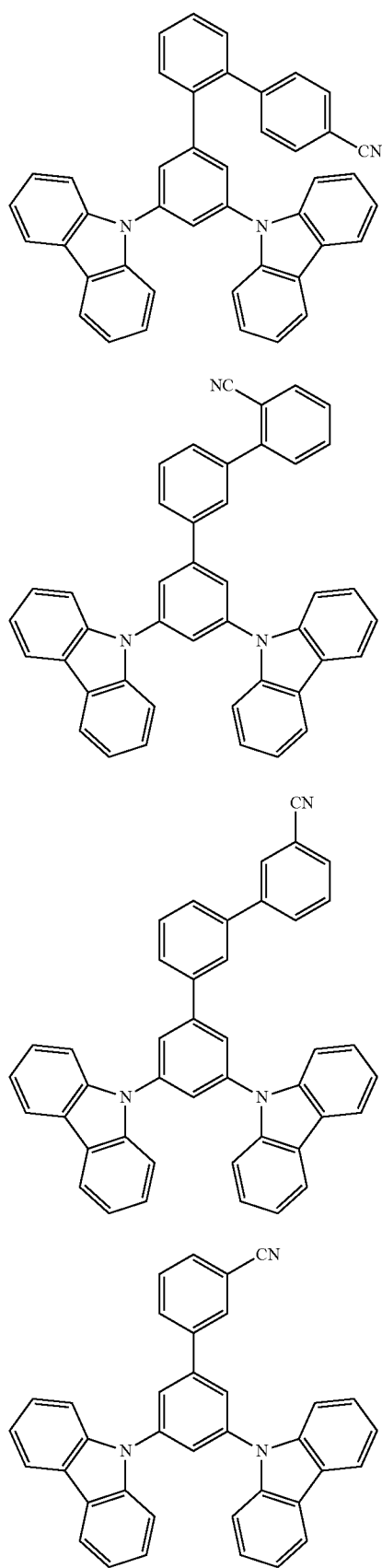
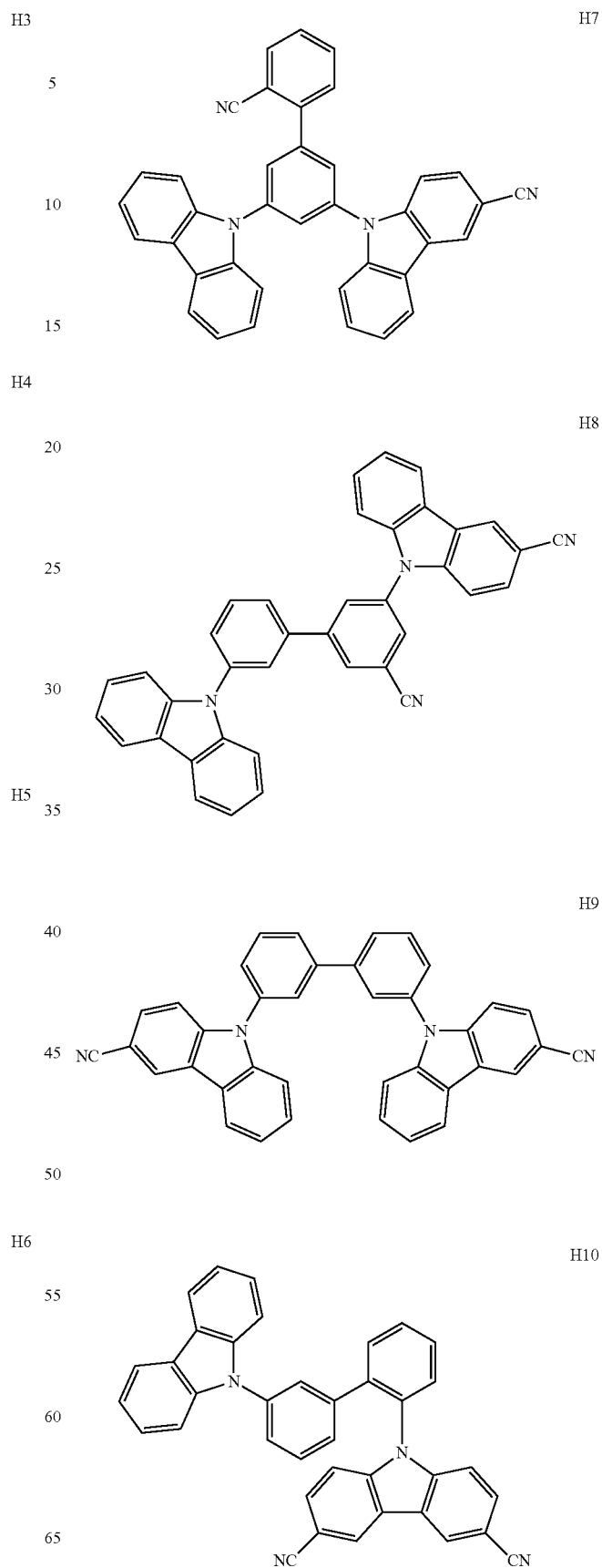

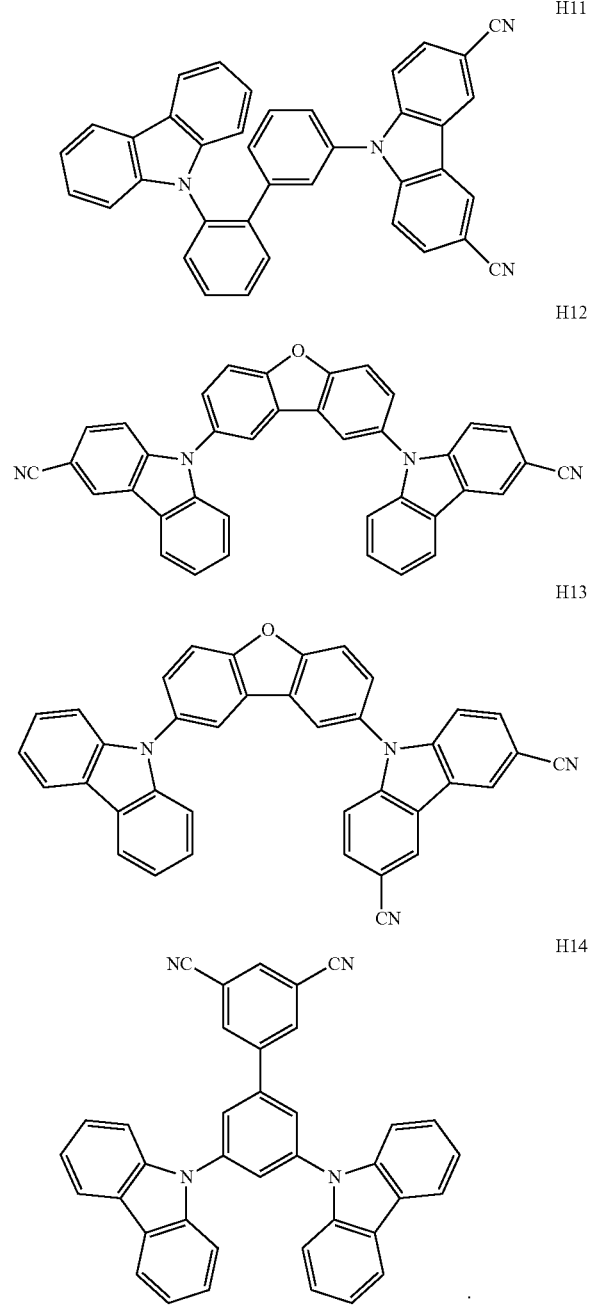

In various embodiments, a highest occupied molecular orbital (HOMO) energy level of the host may be in a range of −5.90 eV to −5.50 eV, a lowest unoccupied molecular orbital (LUMO) energy level of the host may be in a range of −2.30 eV to −1.50 eV, a triplet energy level of the host may be in a range of 2.90 eV to 3.15 eV, and the HOMO energy level, LUMO energy level, and triplet energy level of the host are evaluated by using a DFT method of Gaussian program that is structurally optimized at a level of B3LYP/ 6-31G(d,p). When the host satisfies these ranges of the HOMO energy level, the LUMO energy level, and the triplet energy level, energy transfer to the fluorescent dopant may be promoted, thereby enabling the manufacture of an organic light-emitting device having high efficiency.

The host in the emission layer may include a compound represented by Formulae 1, 2 or 3, and Formulae 1, 2, and 3 may necessarily each include, as described above, two or more "carbazole rings." Due to the inclusion of the carbazole rings, the host may have such electric characteristics (for example, LUMO and HOMO energy levels) that promote energy transfer to a blue fluorescent dopant (for example, the compound represented by Formula 11).

The compound represented by Formula 1, the compound represented by Formula 2, and the compound represented by Formula 3 may each include at least one cyano group. For example, the compound represented by Formula 1, the compound represented by Formula 2, and the compound represented by Formula 3 may each include one cyano group, two, three, or four cyano groups, but the number of cyano groups is not limited thereto. Accordingly, an organic light-emitting device including the host may have high efficiency and a long lifespan.

A HOMO, a LUMO, an energy band gap (Eg), a singlet ($S_1$) energy level value, a triplet ($T_1$) energy level value, and a difference between $T_1$ and $S_1$ of Compounds H1 to H14 and Compounds A1 to A4 were evaluated by using a DFT method of Gaussian program that is structurally optimized at a level of B3LYP/6-31G(d,p). Results thereof are shown in Table 1.

TABLE 1

| Compound No. | HOMO (eV) | LUMO (eV) | Eg (eV) | $S_1$ (eV) | $T_1$ (eV) | $S_1$—$T_1$ (eV) |
| --- | --- | --- | --- | --- | --- | --- |
| H1 | −5.80 | −1.70 | 4.10 | 3.72 | 3.08 | 0.64 |
| H2 | −5.46 | −1.742 | 3.72 | 3.23 | 3.07 | 0.15 |
| H3 | −5.50 | −1.73 | 3.77 | 3.30 | 3.09 | 0.21 |
| H4 | −5.50 | −1.64 | 3.87 | 3.52 | 3.07 | 0.45 |
| H5 | −5.56 | −1.61 | 3.95 | 3.53 | 3.06 | 0.47 |
| H6 | −5.59 | −1.74 | 3.84 | 3.36 | 3.05 | 0.31 |
| H7 | −5.70 | −1.94 | 3.76 | 3.27 | 3.09 | 0.18 |
| H8 | −5.64 | −2.06 | 3.58 | 3.14 | 3.03 | 0.09 |
| H9 | −5.93 | −1.63 | 4.29 | 3.76 | 3.12 | 0.64 |
| H10 | −5.57 | −1.69 | 3.88 | 3.33 | 3.08 | 0.24 |
| H11 | −5.74 | −1.58 | 4.16 | 3.36 | 3.08 | 0.28 |
| H12 | −5.96 | −1.91 | 4.05 | 3.30 | 3.12 | 0.18 |
| H13 | −5.62 | −1.89 | 3.73 | 3.20 | 3.03 | 0.18 |
| H14 | −5.72 | −2.32 | 3.40 | 2.99 | 2.93 | 0.06 |
| A1 | −6.23 | −0.94 | 5.29 | 4.61 | 3.56 | 1.05 |
| A2 | −5.46 | −0.77 | 4.69 | 4.01 | 3.18 | 0.83 |
| A3 | −5.41 | −1.18 | 4.23 | 3.67 | 3.20 | 0.47 |
| A4 | −5.45 | −1.08 | 4.37 | 3.33 | 3.16 | 0.17 |

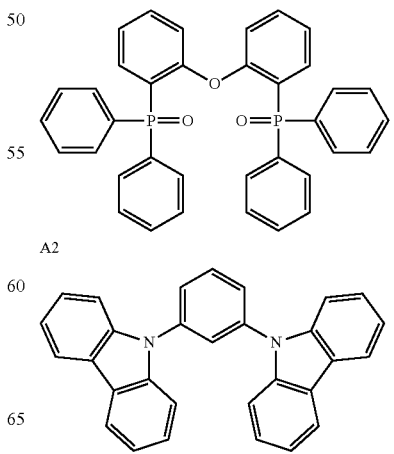

TABLE 1-continued

| Compound No. | HOMO (eV) | LUMO (eV) | Eg (eV) | $S_1$ (eV) | $T_1$ (eV) | $S_1$—$T_1$ (eV) |
|---|---|---|---|---|---|---|

A3

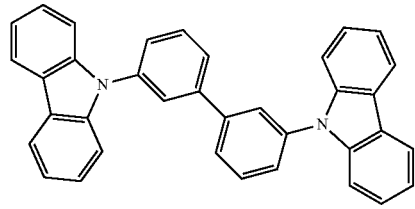 [SMILES: c1cc(-c2cccc(-n3c4ccccc4c4ccccc43)c2)cc(-n2c3ccccc3c3ccccc32)c1]

A4

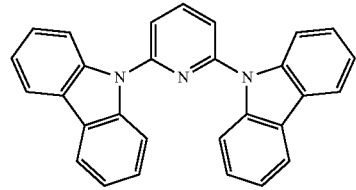 [SMILES: c1cc(-n2c3ccccc3c3ccccc32)nc(-n2c3ccccc3c3ccccc32)c1]

The fluorescent dopant in the emission layer satisfies Equation 2:

$$0 \text{ eV} \leq E_{S1}(FD) - E_{T1}(FD) \leq 0.2 \text{ eV}. \quad \text{Equation 2}$$

In Equation 2, $E_{T1}(FD)$ indicates a triplet energy level (eV) of the fluorescent dopant, $E_{S1}(FD)$ indicates a singlet energy level (eV) of the fluorescent dopant, and $E_{T1}(FD)$ and $E_{S1}(FD)$ are evaluated by using a DFT method of Gaussian program that is structurally optimized at a level of B3LYP/6-31G(d,p).

Since the fluorescent dopant satisfies Equation 2, up-conversion of energy from the triplet state to the single state of the fluorescent dopant may be promoted, and accordingly, the fluorescent dopant may emit high-efficiency delayed fluorescence.

In various embodiments, the fluorescent dopant may be a thermally activated delayed fluorescence (TADF) dopant.

In various embodiments, the fluorescent dopant may not include a cyano group.

In various embodiments, the fluorescent dopant may be a compound represented by Formula 11:

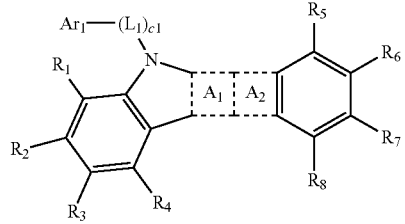

Formula 11

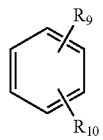

Formula 12A

Formula 12B ring $A_1$ in Formula 11 may be a group represented by Formula 12A, ring $A_2$ in Formula 11 may be a group represented by Formula 12B, $X_1$ in Formula 12B may be N-[$(L_2)_{c2}$-Ar$_2$], O, or S, $L_1$ and $L_2$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, c1 and c2 may each independently be an integer selected from 0 to 4, Ar$_1$ and Ar$_2$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_1$ to $R_{10}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), and —B($Q_6$)($Q_7$), and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, a substituted divalent non-aromatic condensed polycyclic group, a substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, a substituted monovalent non-aromatic condensed polycyclic group, and a substituted monovalent non-aromatic condensed heteropolycyclic group may be selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$) and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ may each independently be selected from hydrogen, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, the fluorescent dopant may be a compound represented by one formula selected from Formulae 11-1 to 11-6:

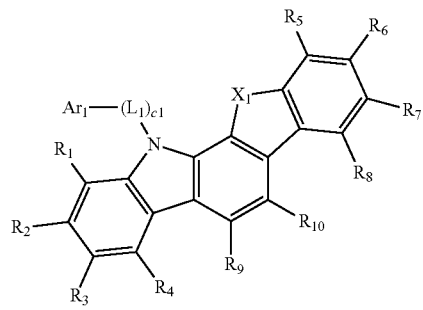

Formula 11-1

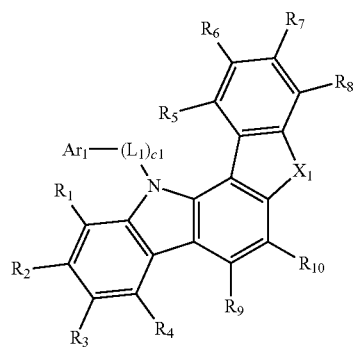

Formula 11-2

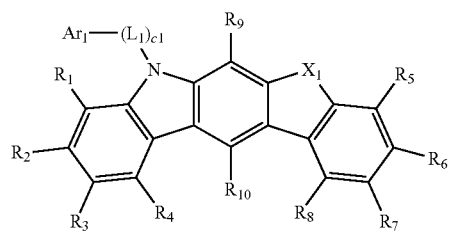

Formula 11-3

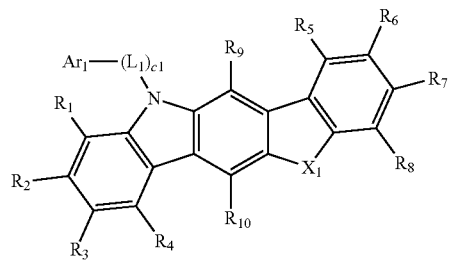

Formula 11-4

Formula 11-5

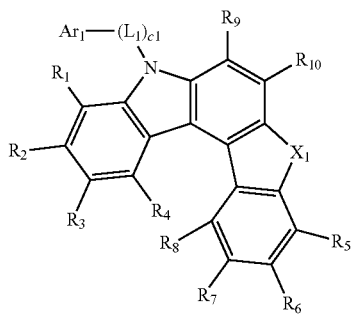

Formula 11-6

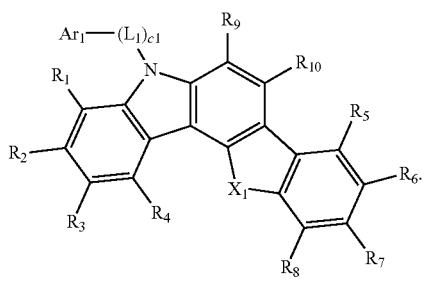

$X_1$, $L_1$, $L_2$, c1, c2, $Ar_1$, $Ar_2$, and $R_1$ to $R_{10}$ in Formulae 11-1 to 11-6 may be substantially the same as described above.

For example, $X_1$ in Formulae 12B and 11-1 to 11-6 may be $N\text{-}[(L_2)_{c2}\text{-}Ar_2]$.

In various embodiments, $L_1$ and $L_2$ in Formulae 11 and 11-1 to 11-6 may each independently be selected from
a phenylene group, a naphthylene group, a fluorenylene group, a pyridinylene group, a pyrimidinylene group, a pyrazinylene group, a pyridazinylene group, a triazinylene group, a quinolinylene group, an isoquinolinylene group, a carbazolylene group, a dibenzofuranylene group, a dibenzothiophenylene group, and an indolocarbazolylene group; and
a phenylene group, a naphthylene group, a fluorenylene group, a pyridinylene group, a pyrimidinylene group, a pyrazinylene group, a pyridazinylene group, a triazinylene group, a quinolinylene group, an isoquinolinylene group, a carbazolylene group, a dibenzofuranylene group, a dibenzothiophenylene group, and an indolocarbazolylene group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, an indolocarbazolyl group, —$Si(Q_{31})(Q_{32})(Q_{33})$, and —$N(Q_{34})(Q_{35})$,
wherein $Q_{31}$ to $Q_{35}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, $L_1$ and $L_2$ in Formulae 11 and 11-1 to 11-6 may each independently be selected from
a phenylene group and a naphthylene group; and
a phenylene group and a naphthylene group, each substituted with at least one selected from deuterium, a $C_1$-$C_{10}$ alkyl group, a $C_1$-$C_{10}$ alkoxy group, a phenyl group, a biphenyl group, and a terphenyl group, but are not limited thereto.

In various embodiments, c1 and c2 in Formulae 11 and 11-1 to 11-6 indicate numbers of groups $L_1$ and $L_2$, respectively, and for example, may each independently be 0, 1, or 2. When c1 is 0, *-$(L_1)_{c1}$-*' indicates a single bond, when c2 is 0, *-$(L_2)_{c2}$-*' indicates a single bond, when c1 is two or more, two or more groups $L_1$ may be identical to or different from each other, and when c2 is two or more, two or more groups $L_2$ may be identical to or different from each other.

In various embodiments, c1 and c2 in Formulae 11 and 11-1 to 11-6 may be 1 or 2.

In various embodiments, in Formulae 11 and 11-1 to 11-6,
c1 may be 1,
$L_1$ may be selected from
a phenylene group and a naphthylene group; and
a phenylene group and a naphthylene group, each substituted with at least one selected from deuterium, a $C_1$-$C_{10}$ alkyl group, a $C_1$-$C_{10}$ alkoxy group, a phenyl group, a biphenyl group, and a terphenyl group, but is not limited thereto.

$Ar_1$ and $Ar_2$ in Formulae 11 and 11-1 to 11-6 may each independently be selected from
a group represented by Formula 13;
a phenyl group, a biphenyl group, a terphenyl group, a naphthyl group, a fluorenyl group, a quinolinyl group, an isoquinolinyl group, a carbazolyl group, a dibenzofuranyl group, a dibenzothiophenyl group, and an indolocarbazolyl group; and
a phenyl group, a biphenyl group, a terphenyl group, a naphthyl group, a fluorenyl group, a quinolinyl group, an isoquinolinyl group, a carbazolyl group, a dibenzofuranyl group, a dibenzothiophenyl group, and an indolocarbazolyl group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, an indolocarbazolyl group, —$Si(Q_{31})(Q_{32})(Q_{33})$, and —$N(Q_{34})(Q_{35})$, and
$Q_{31}$ to $Q_{35}$ may each independently be selected from a $C_1$-$C_{10}$ alkyl group, a $C_1$-$C_{10}$ alkoxy group, a phenyl group, a biphenyl group, a terphenyl group, and a naphthyl group:

Formula 13

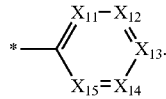

In Formula 13,
$X_{11}$ may be N or C-$[(L_{11})_{c11}\text{-}Ar_{11}]$,
$X_{12}$ may be N or C-$[(L_{12})_{c12}\text{-}Ar_{12}]$,
$X_{13}$ may be N or C-$[(L_{13})_{c13}\text{-}Ar_{13}]$,
$X_{14}$ may be N or C-$[(L_{14})_{c14}\text{-}Ar_{14}]$,
$X_{15}$ may be N or C-$[(L_{15})_{c15}\text{-}Ar_{15}]$, and
provided that at least one selected from $X_{11}$ to $X_{15}$ may be N,
$L_{11}$ to $L_{15}$ may each independently be selected from
a phenylene group, a naphthylene group, a fluorenylene group, a pyridinylene group, a pyrimidinylene group, a pyrazinylene group, a pyridazinylene group, a triazinylene group, a quinolinylene group, an isoquinolinylene group, a carbazolylene group, a dibenzofuranylene group, a dibenzothiophenylene group, and an indolocarbazolylene group; and a phenylene group, a naphthylene group, a fluorenylene group, a pyridinylene group, a pyrimidinylene group, a pyrazinylene group, a pyridazinylene group, a triazinylene group, a quinolinylene group, an isoquinolinylene group, a carbazolylene group, a dibenzofuranylene group, a dibenzothiophenylene group, and an indolocarbazolylene group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, and an indolocarbazolyl group;

c11 to c15 may each independently be 0 or 1, $Ar_{11}$ to $Ar_{15}$ may each independently be selected from a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, and an indolocarbazolyl group; and a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, and an indolocarbazolyl group, each substituted with at least one selected from deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a quinolinyl group, an isoquinolinyl group, a carbazolyl group, a dibenzofuranyl group, a dibenzothiophenyl group, and an indolocarbazolyl group, and

* indicates a binding site to a neighboring atom.

c11 to c15 in Formula 13 indicate numbers of groups $L_{11}$ to $L_{15}$, respectively, wherein when c11 is 0, *-$(L_{11})_{c11}$-*' is a single bond, when c12 is 0, *-$(L_{12})_{c12}$-*' is a single bond, when c13 is 0, *-$(L_{13})_{c13}$-*' is a single bond, when c14 is 0, *-$(L_{14})_{c14}$-*' is a single bond, and when c15 is 0, *-$(L_{15})_{c15}$-*' is a single bond.

For example, at least one selected from $Ar_1$ and $Ar_2$ in Formulae 11 and 11-1 to 11-6 may each independently be a group represented by Formula 13, but is not limited thereto.

In various embodiments, $R_1$ to $R_{10}$ in Formulae 11 and 11-1 to 11-6 may each independently be selected from hydrogen, deuterium, a $C_1$-$C_{10}$ alkyl group, a $C_1$-$C_{10}$ alkoxy group, a phenyl group, a biphenyl group, a terphenyl group, a naphthyl group, a fluorenyl group, a pyridinyl group, a pyrimidinyl group, a pyrazinyl group, a pyridazinyl group, a triazinyl group, a carbazolyl group, a dibenzofuranyl group, a dibenzothiophenyl group, an indolocarbazolyl group, —Si($Q_1$)($Q_2$)($Q_3$), and —N($Q_4$)($Q_5$), wherein $Q_1$ to $Q_5$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, the fluorescent dopant may be, an acridine compound.

For example, the fluorescent dopant may be a compound represented by Formula 14A:

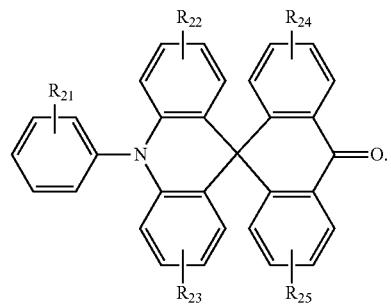

Formula 14A $R_{21}$ to $R_{25}$ in Formula 14A may each independently be hydrogen, deuterium, a cyano group, a $C_1$-$C_{10}$ alkyl group, a phenyl group, a biphenyl group, or a terphenyl group.

In various embodiments, the fluorescent dopant may be selected from Compounds 1 to 81 and 201 to 203.

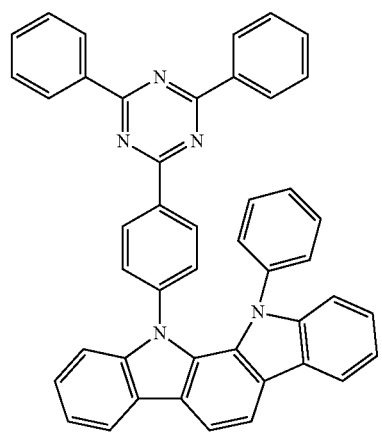

1

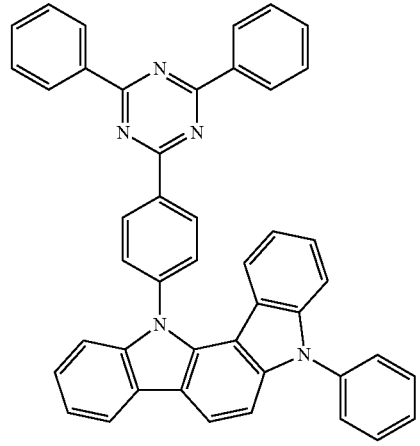 [SMILES: c1ccc(-c2nc(-c3ccccc3)nc(-c3ccc(-n4c5ccccc5c5ccc6c(c7ccccc7n6-c6ccccc6)c54)cc3)n2)cc1]

2

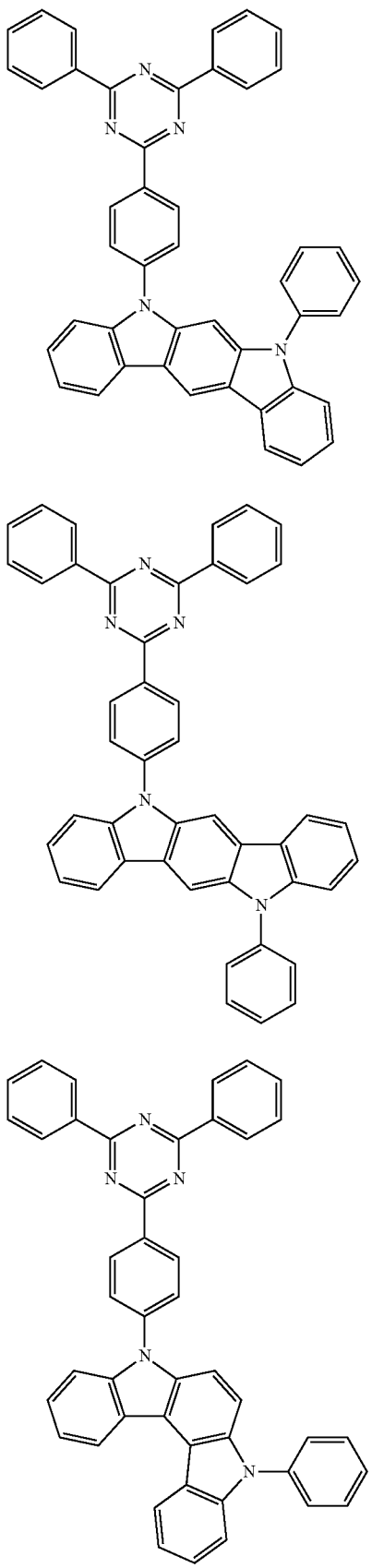
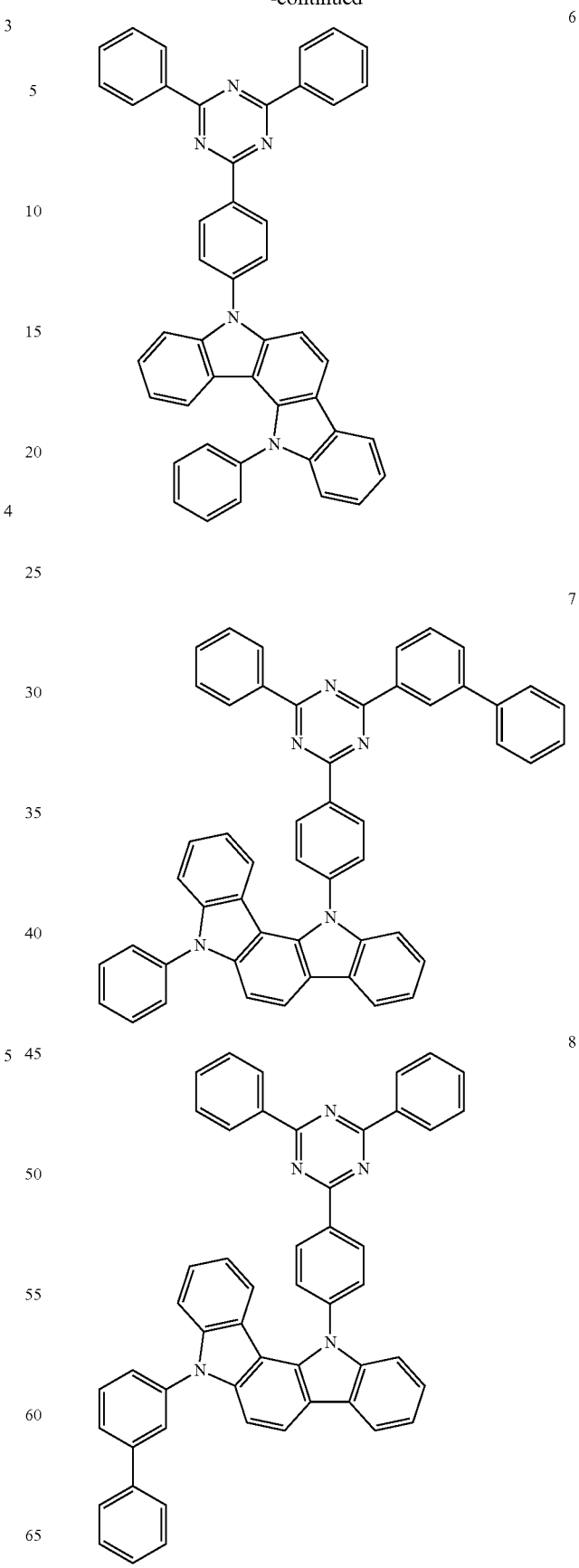

9
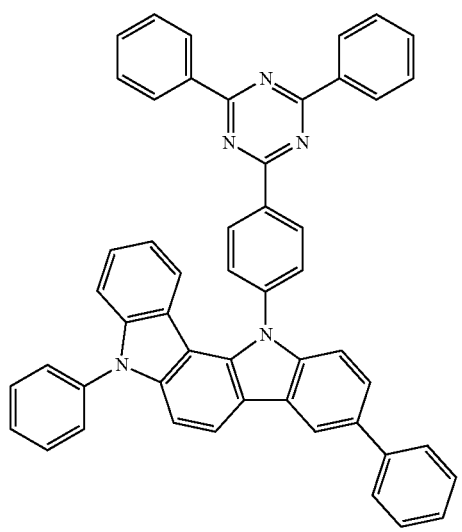
10
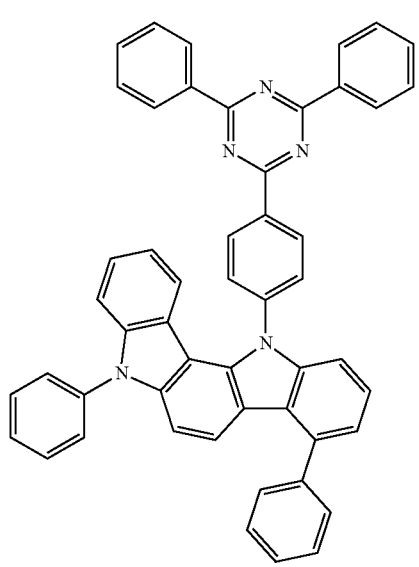
11
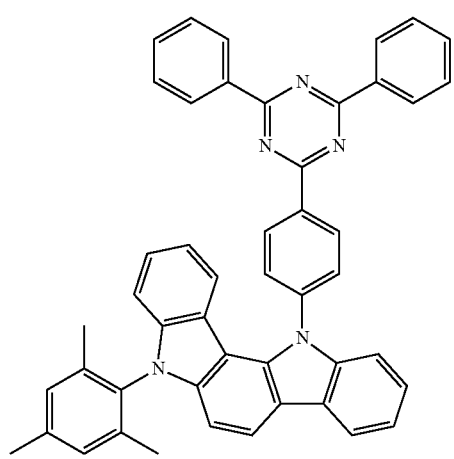
12
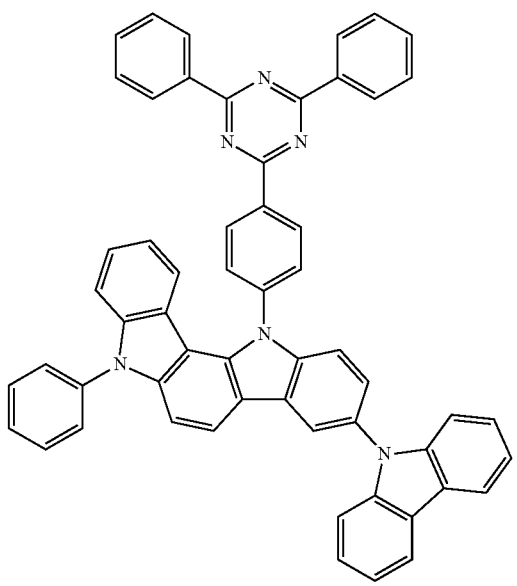
13
14
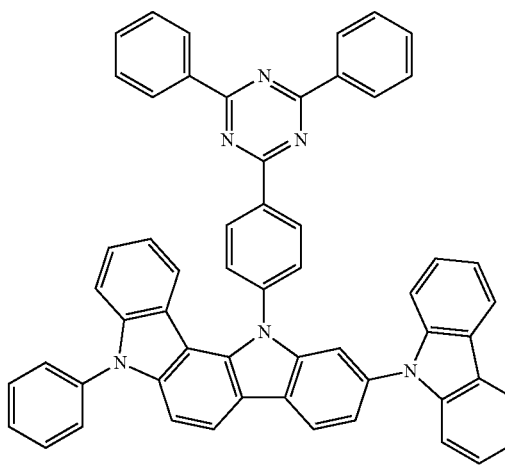

15
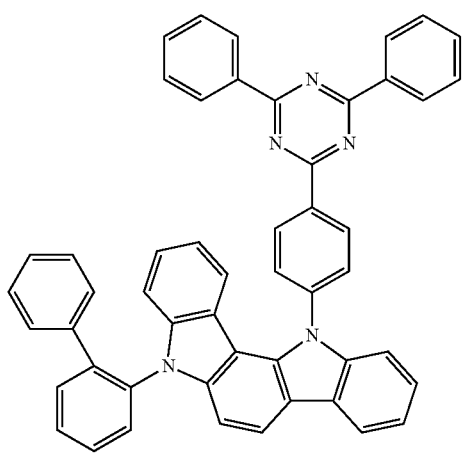
16
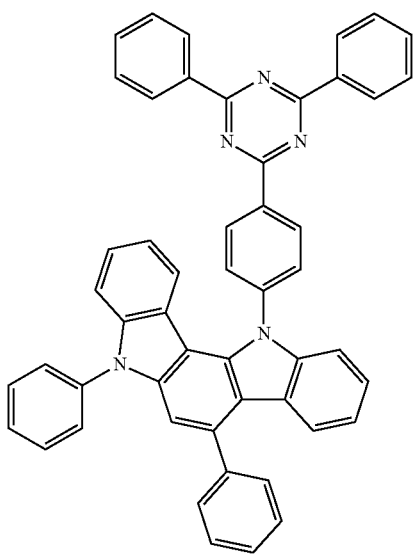
17
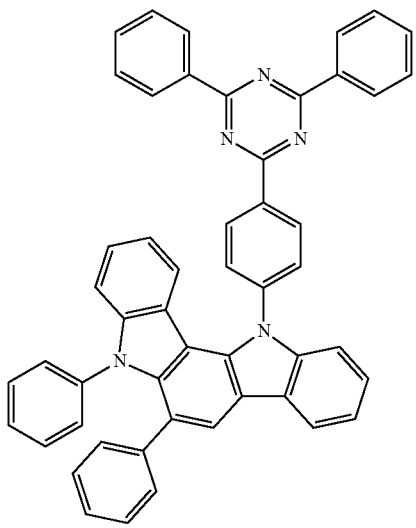
18
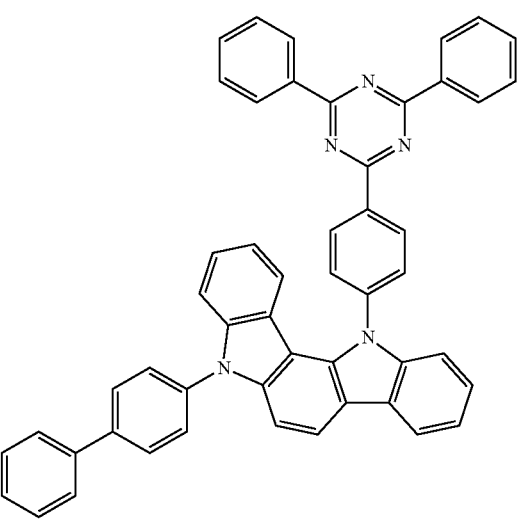
19
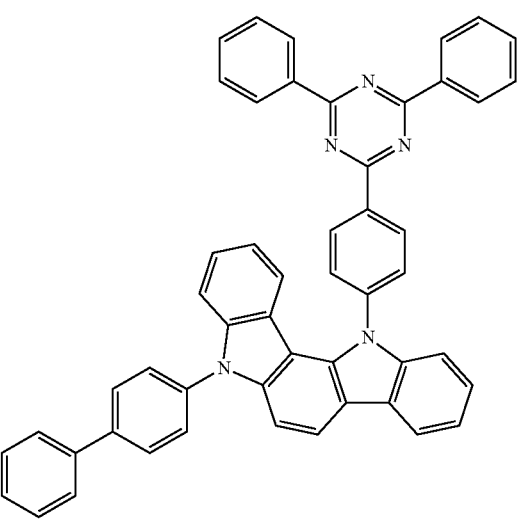

31
-continued
20
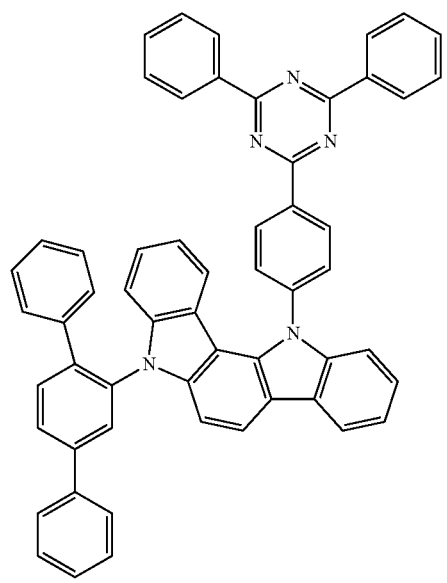
21
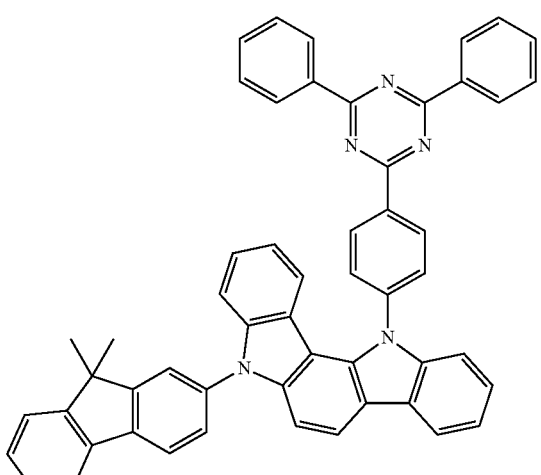
22
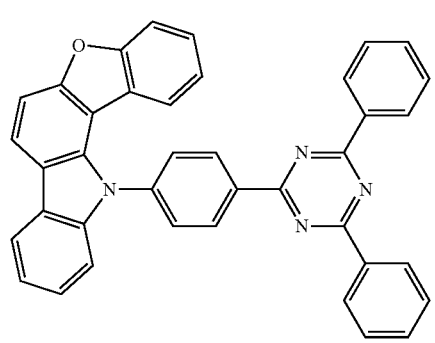
32
-continued
23
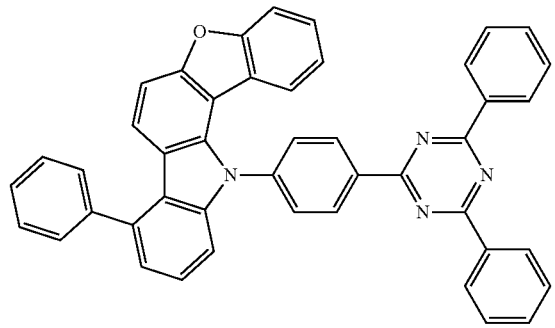
24
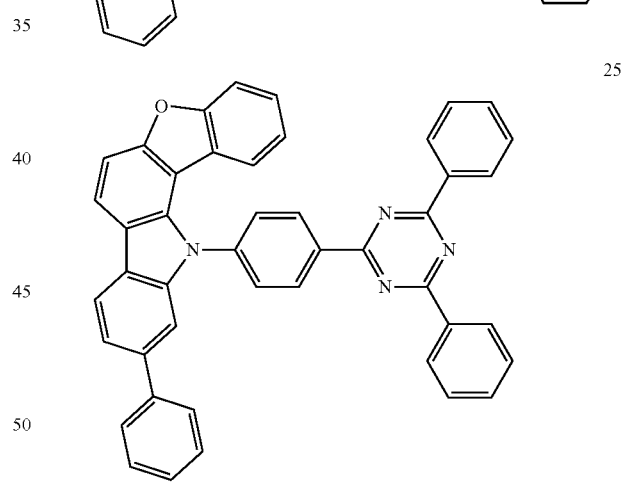
26
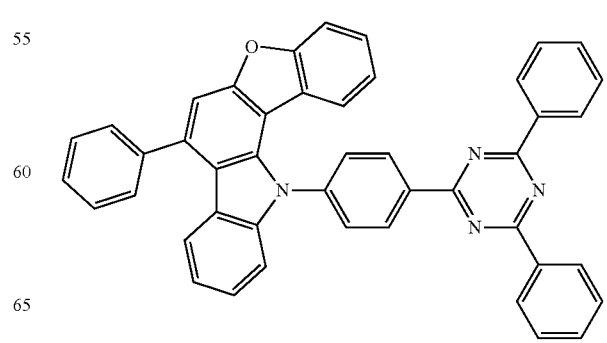

27
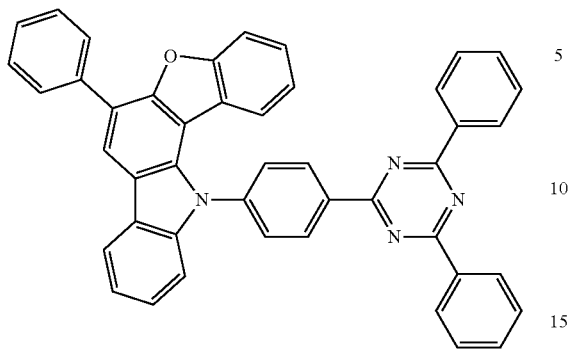
28
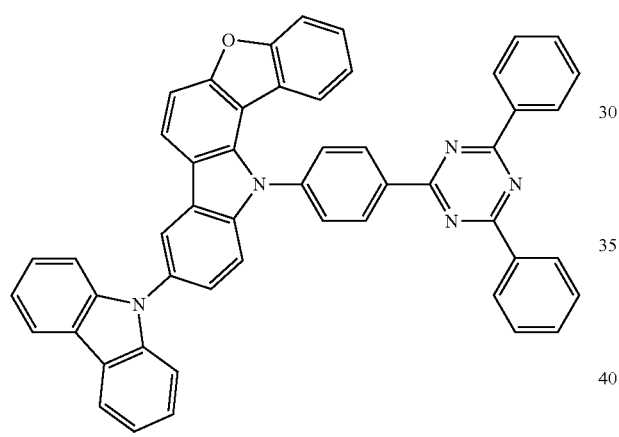
29
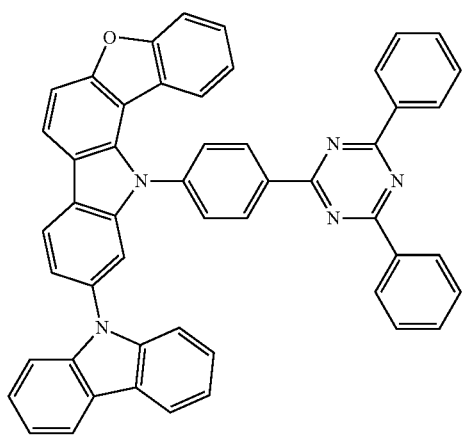
30
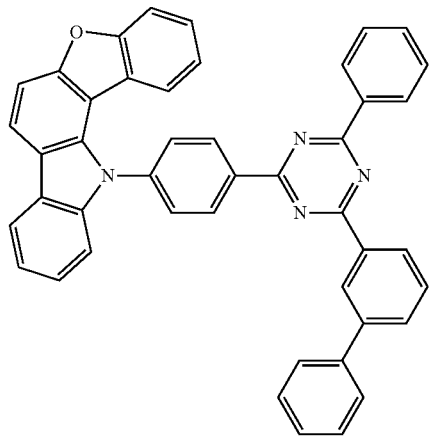
31
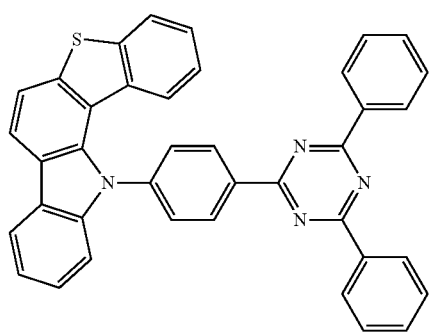
32
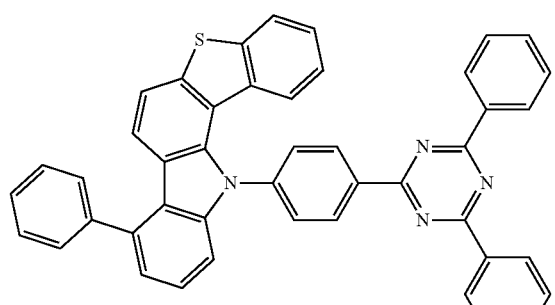
33
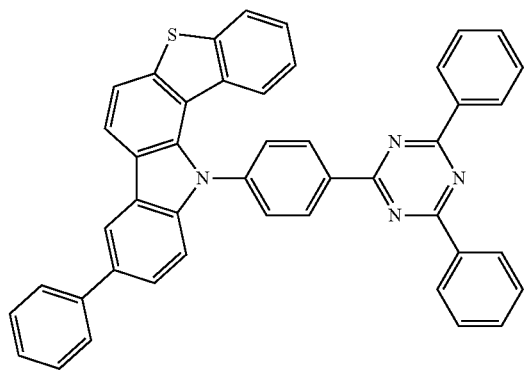

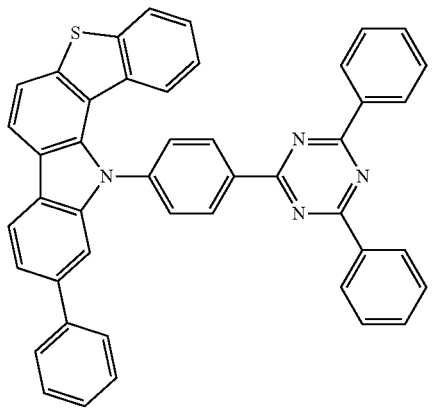
34
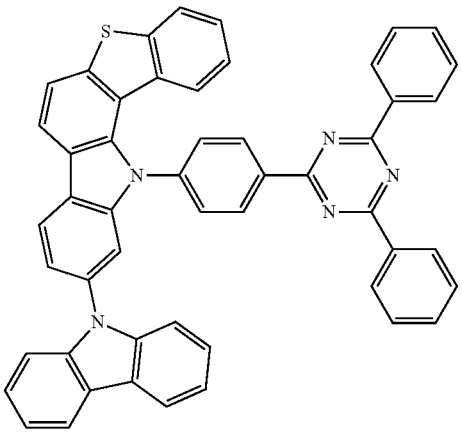
38
35
39
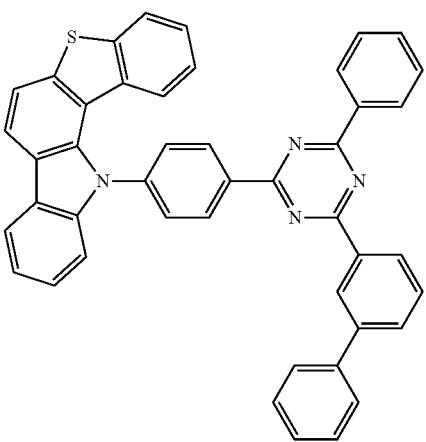
36
40
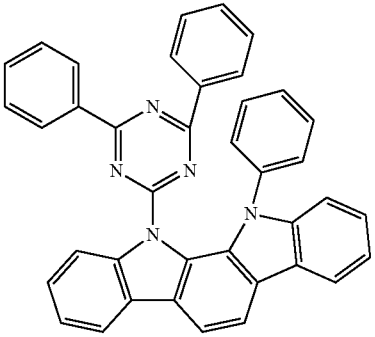
37
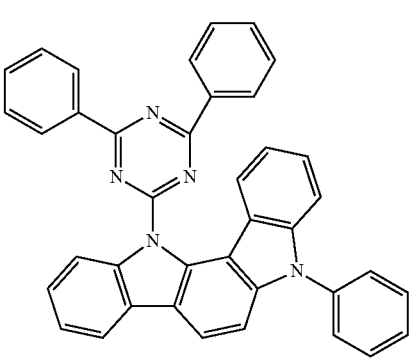
41

42
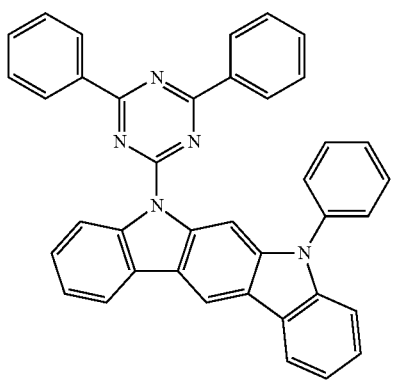
43
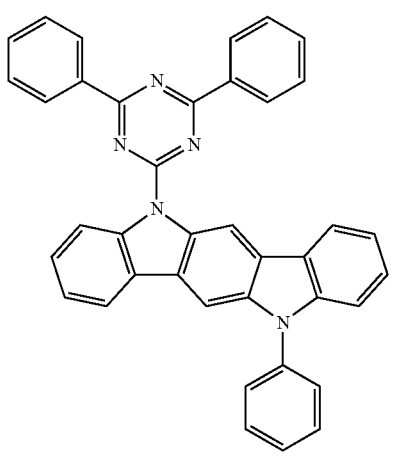
44
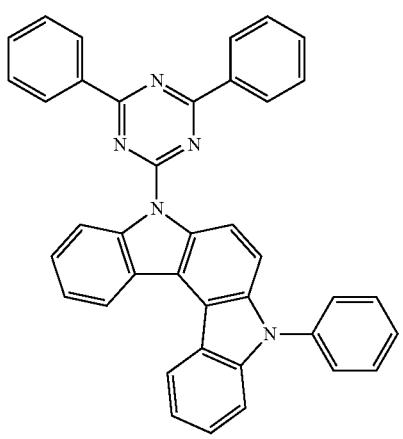
45
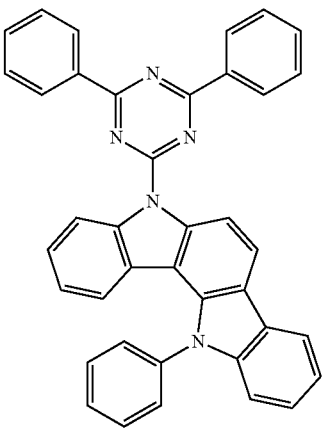
46
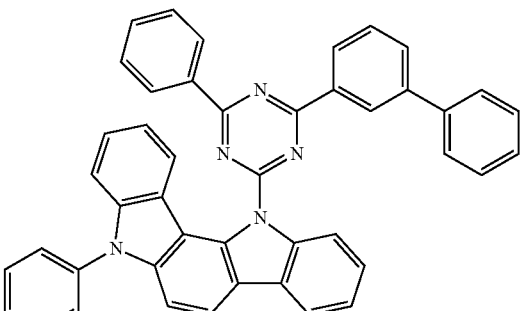
47
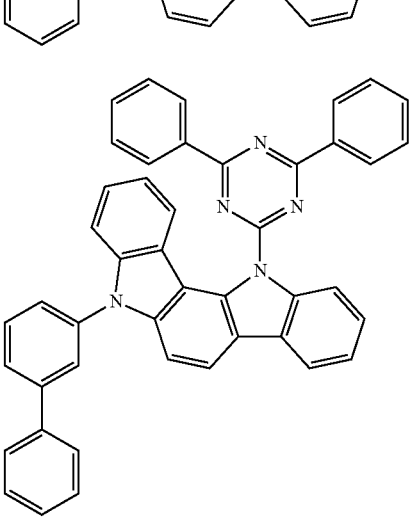
48
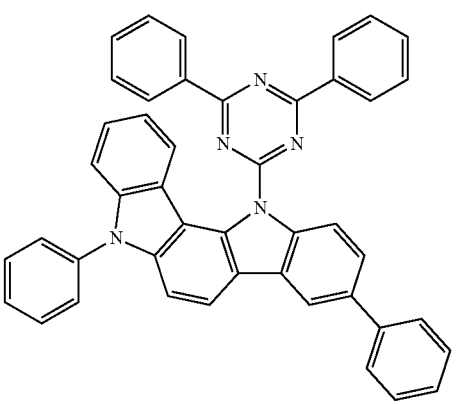

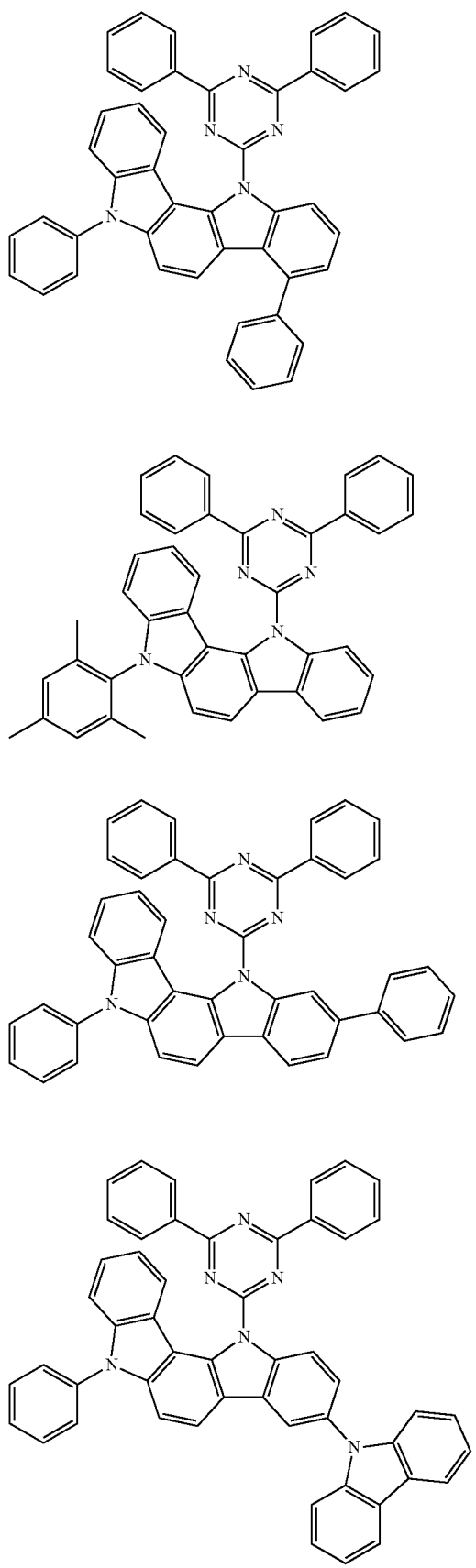
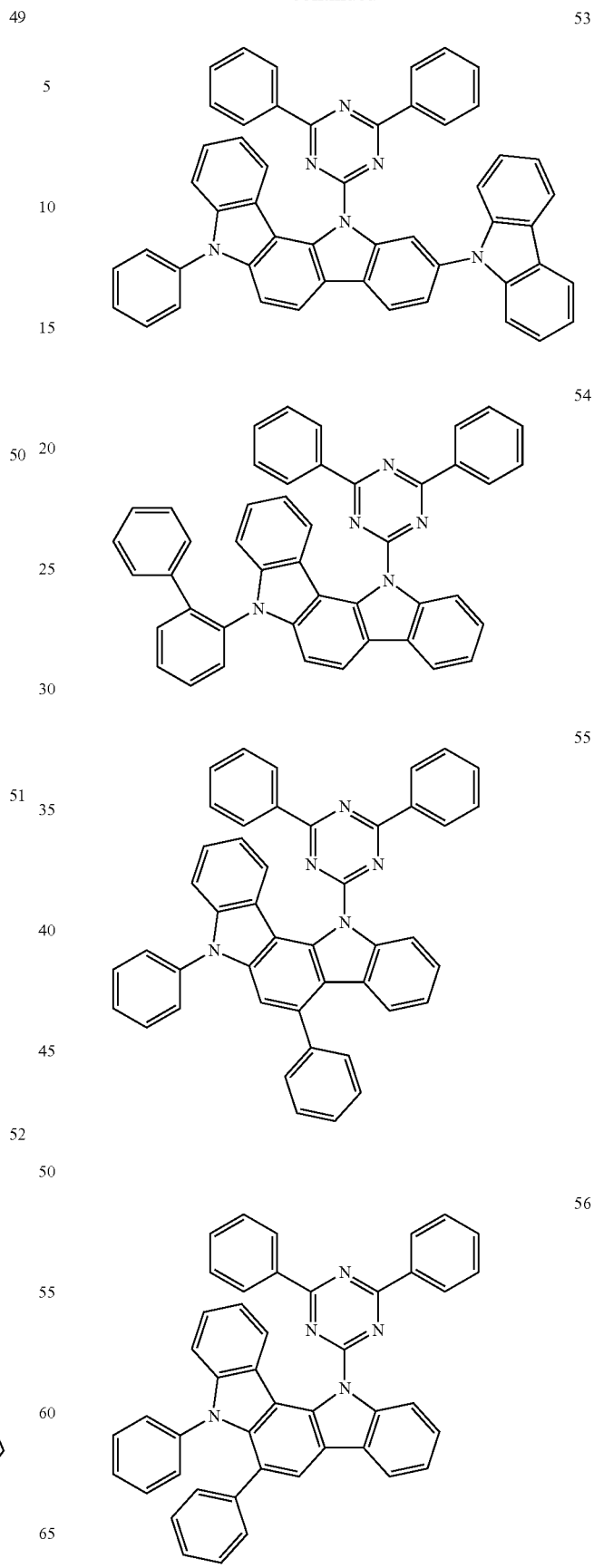

57
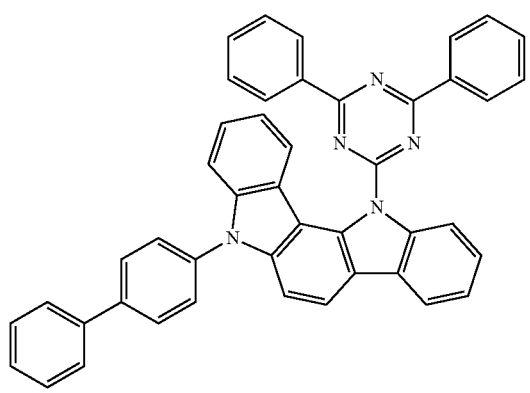
58
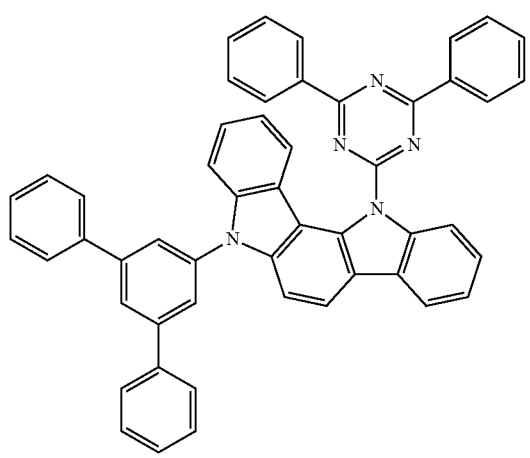
59
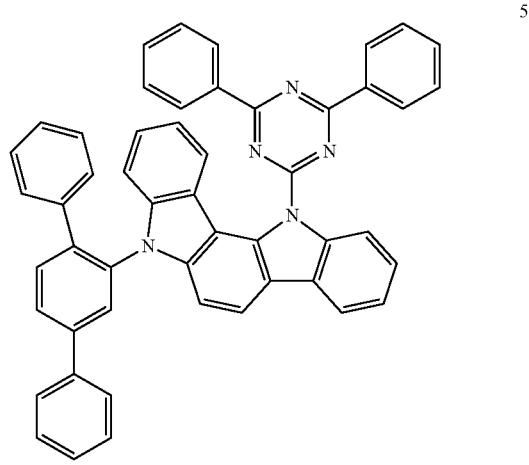
60
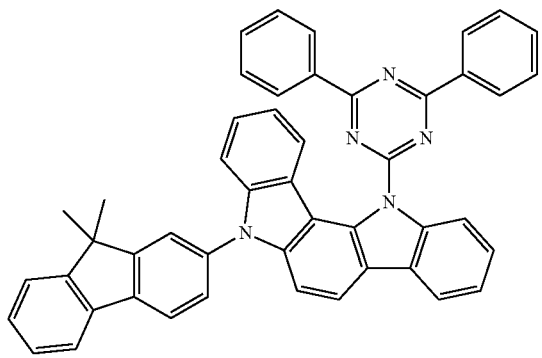
61
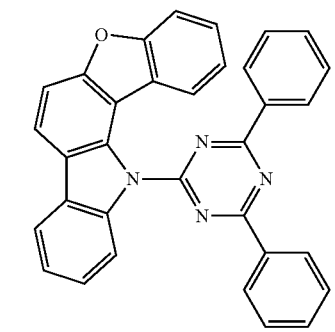
62
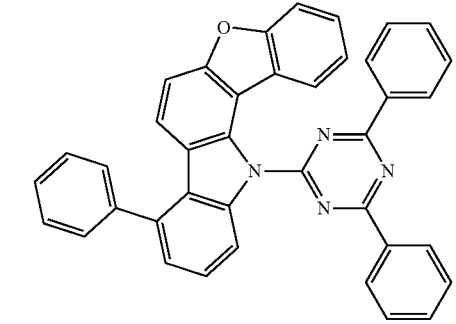
63
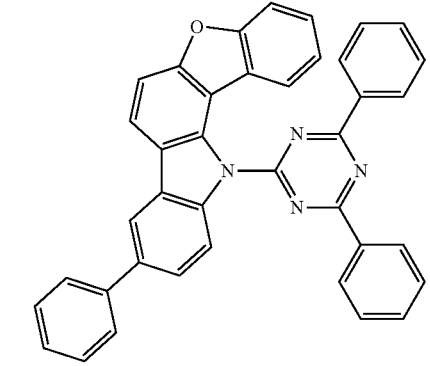

64
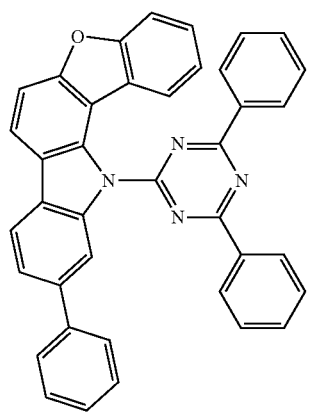
65
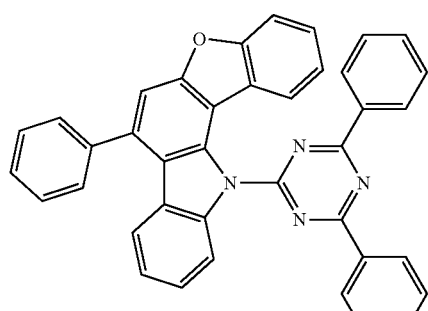
66
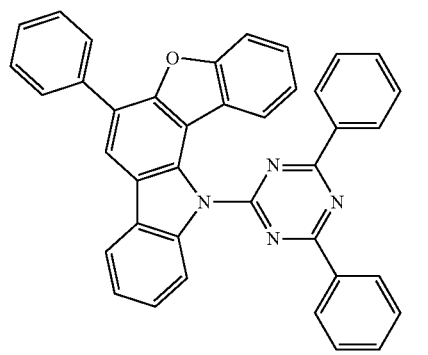
67
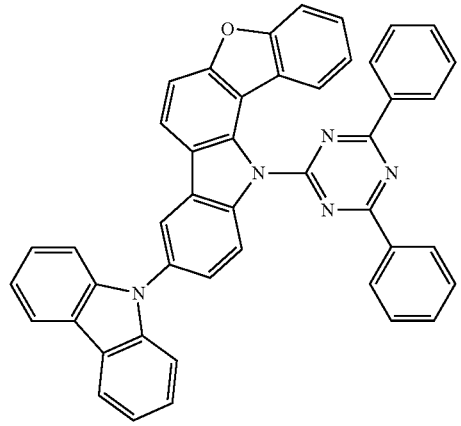
68
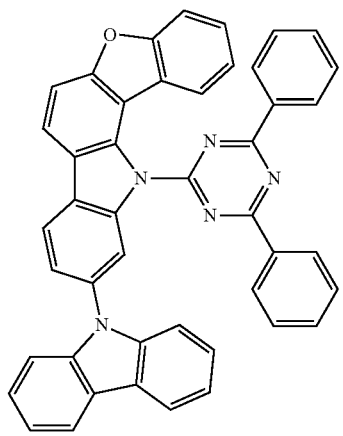
69
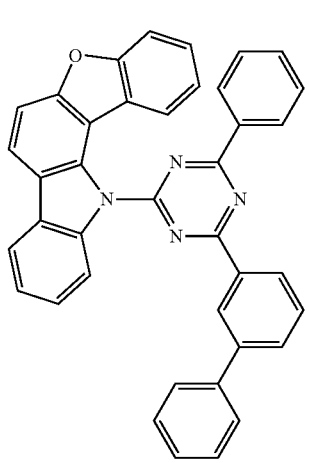
70
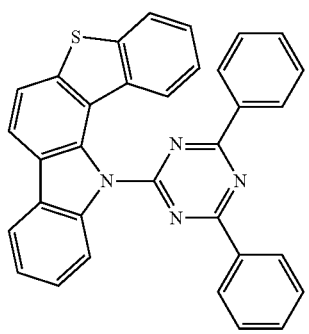
71
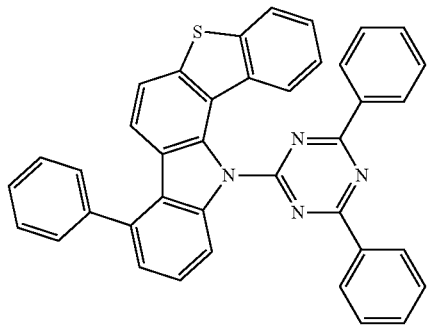

72
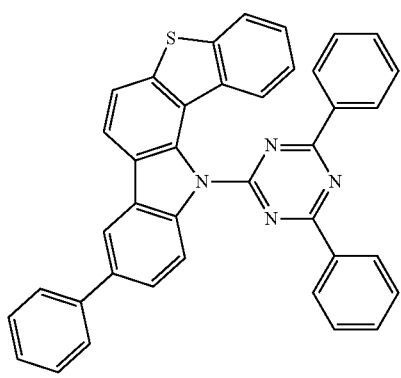
73
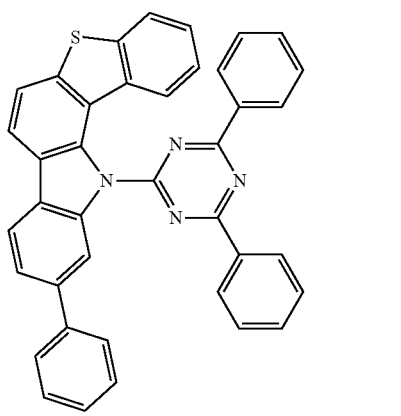
74
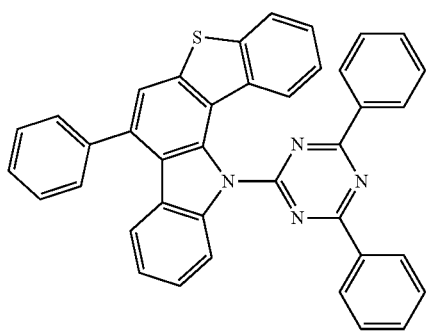
75
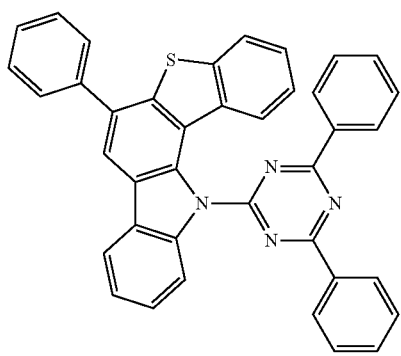
76
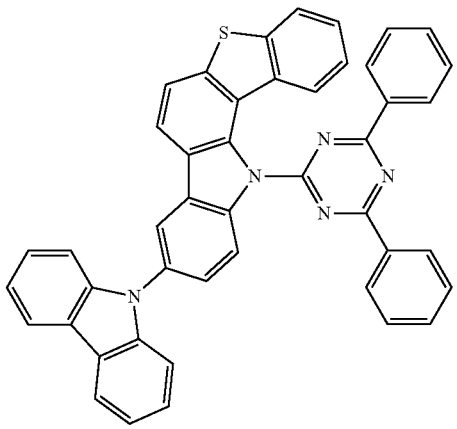
77
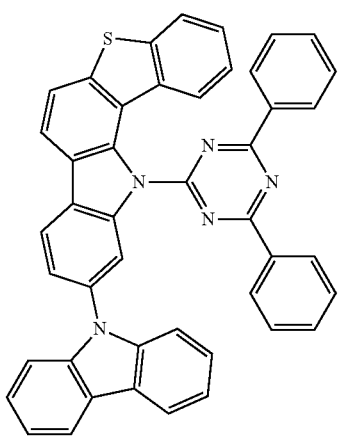
78
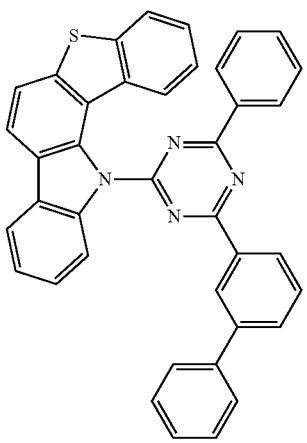

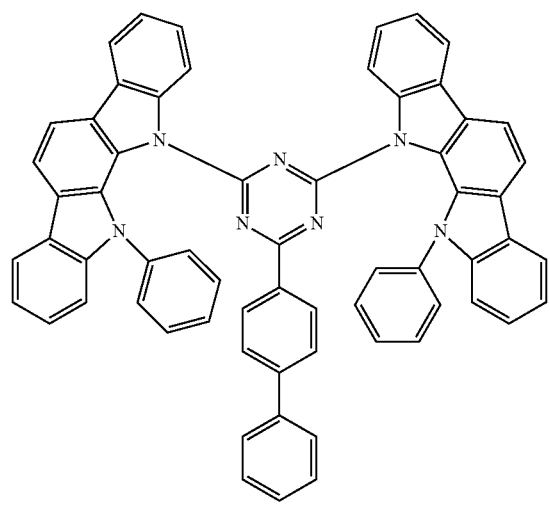
79
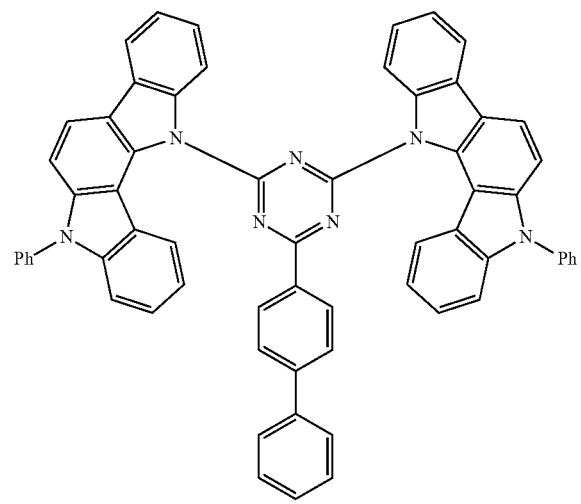
80
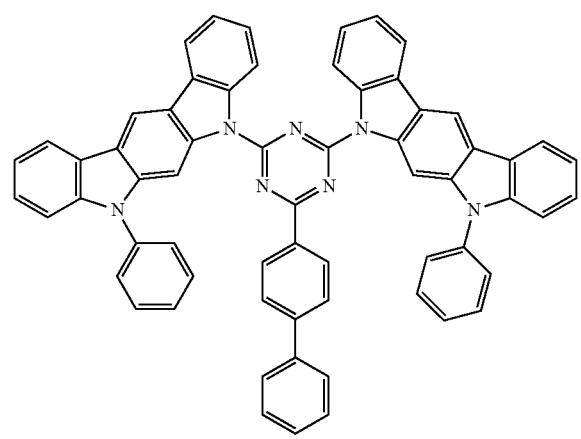
81
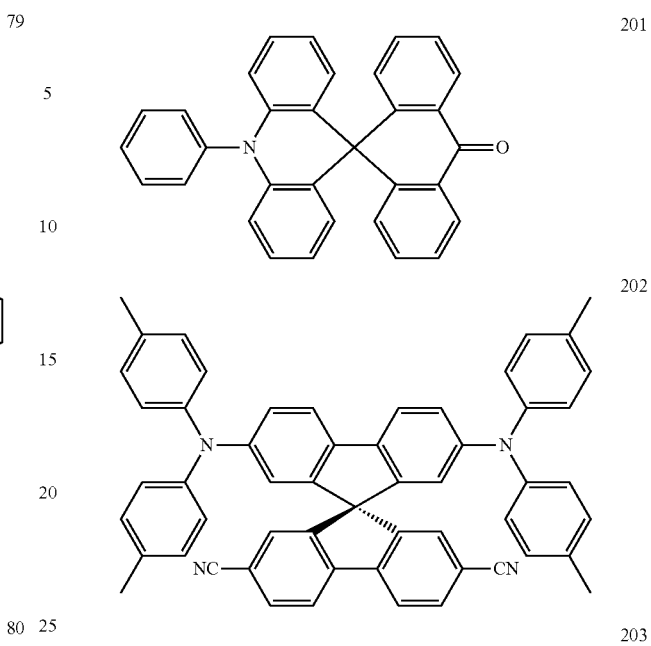
201
202
203
A HOMO, a LUMO, a triplet ($T_1$) energy level value, a singlet ($S_1$) energy level value, and a difference between $T_1$ and $S_1$ of Compounds 2 and 201 to 203 and Compound B1 are evaluated by using a DFT method of Gaussian program that is structurally optimized at a level of B3LYP/6-31G(d, p). Results thereof are shown in Table 2.
TABLE 2
| Compound No. | HOMO (eV) | LUMO (eV) | Eg (eV) | $S_1$ (eV) | $T_1$ (eV) | $S_1$—$T_1$ (eV) |
|---|---|---|---|---|---|---|
| 2 | −5.04 | −1.94 | 3.10 | 2.70 | 2.62 | 0.08 |
| 201 | −5.13 | −1.70 | 3.43 | 2.82 | 2.82 | 0.00 |
| 202 | — | — | — | 2.69 | 2.63 | 0.06 |
| 203 | — | — | — | 2.72 | 2.65 | 0.07 |
| B1 | −5.69 | −2.57 | 3.12 | 2.49 | 2.38 | 0.11 |

TABLE 2-continued

| Compound No. | HOMO (eV) | LUMO (eV) | Eg (eV) | S$_1$ (eV) | T$_1$ (eV) | S$_1$—T$_1$ (eV) |
|---|---|---|---|---|---|---|

2

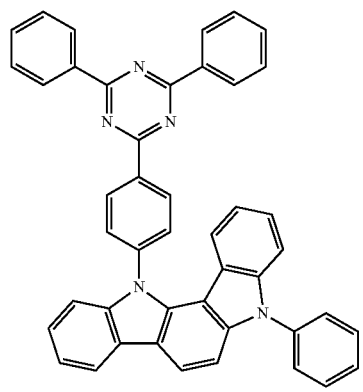

B1

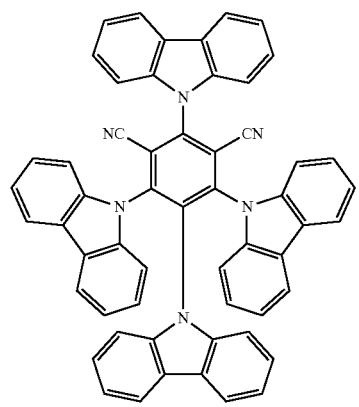 [SMILES: N#Cc1c(-n2c3ccccc3c3ccccc32)c(C#N)c(-n2c3ccccc3c3ccccc32)c(-n2c3ccccc3c3ccccc32)c1-n1c2ccccc2c2ccccc21]

201

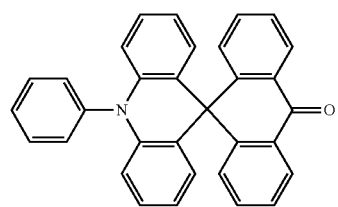 [SMILES: O=C1c2ccccc2C2(c3ccccc31)c1ccccc1N(c1ccccc1)c1ccccc12]

202

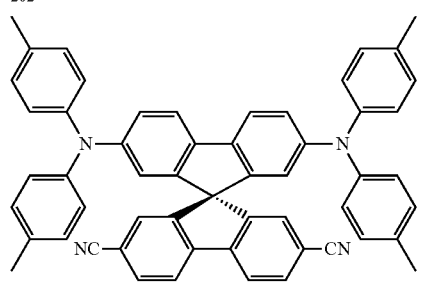

TABLE 2-continued

| Compound No. | HOMO (eV) | LUMO (eV) | Eg (eV) | S$_1$ (eV) | T$_1$ (eV) | S$_1$—T$_1$ (eV) |
|---|---|---|---|---|---|---|

203

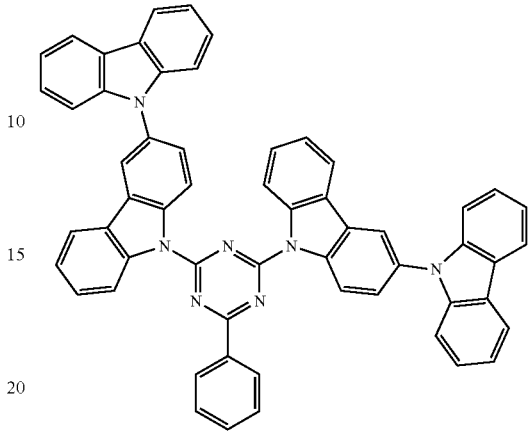

Differences between triplet energy levels of Compounds H1 to H14 and A1 to A4 and triplet energy levels of Compounds 2, 201 to 203, and B1 are shown in Tables 3 and 4.

TABLE 3

| Compound No. | T$_1$ (eV) | Difference with respect to triplet energy level (2.62) of Compound 2 (eV) | Difference with respect to triplet energy level (2.82) of Compound 201 (eV) | Difference with respect to triplet energy level (2.38) of Compound B1 (eV) |
|---|---|---|---|---|
| H1 | 3.08 | 0.46 | 0.26 | 0.70 |
| H2 | 3.07 | 0.45 | 0.25 | 0.69 |
| H3 | 3.09 | 0.47 | 0.27 | 0.71 |
| H4 | 3.07 | 0.45 | 0.25 | 0.69 |
| H5 | 3.06 | 0.44 | 0.24 | 0.68 |
| H6 | 3.05 | 0.43 | 0.23 | 0.67 |
| H7 | 3.09 | 0.47 | 0.27 | 0.71 |
| H8 | 3.03 | 0.41 | 0.21 | 0.65 |
| H9 | 3.12 | 0.50 | 0.30 | 0.74 |
| H10 | 3.08 | 0.46 | 0.26 | 0.70 |
| H11 | 3.08 | 0.46 | 0.26 | 0.70 |
| H12 | 3.12 | 0.50 | 0.30 | 0.74 |
| H13 | 3.03 | 0.41 | 0.21 | 0.65 |
| H14 | 2.93 | 0.31 | 0.11 | 0.55 |
| A1 | 3.56 | 0.94 | 0.74 | 1.18 |
| A2 | 3.18 | 0.56 | 0.36 | 0.80 |
| A3 | 3.20 | 0.58 | 0.38 | 0.82 |
| A4 | 3.16 | 0.54 | 0.34 | 0.78 |

TABLE 4

| Compound No. | T$_1$ (eV) | Difference with respect to triplet energy level (2.63) of Compound 202 (eV) | Difference with respect to triplet energy level (2.65) of Compound 203 (eV) |
|---|---|---|---|
| H1 | 3.08 | 0.45 | 0.43 |
| H2 | 3.07 | 0.44 | 0.42 |
| H3 | 3.09 | 0.46 | 0.44 |
| H4 | 3.07 | 0.44 | 0.42 |
| H5 | 3.06 | 0.43 | 0.41 |
| H6 | 3.05 | 0.42 | 0.40 |
| H7 | 3.09 | 0.46 | 0.44 |
| H8 | 3.03 | 0.40 | 0.38 |
| H9 | 3.12 | 0.49 | 0.47 |
| H10 | 3.08 | 0.45 | 0.43 |

TABLE 4-continued

| Compound No. | $T_1$ (eV) | Difference with respect to triplet energy level (2.63) of Compound 202 (eV) | Difference with respect to triplet energy level (2.65) of Compound 203 (eV) |
|---|---|---|---|
| H11 | 3.08 | 0.45 | 0.43 |
| H12 | 3.12 | 0.49 | 0.47 |
| H13 | 3.03 | 0.40 | 0.38 |
| H14 | 2.93 | 0.30 | 0.28 |
| A1 | 3.56 | 0.93 | 0.91 |
| A2 | 3.18 | 0.55 | 0.53 |
| A3 | 3.20 | 0.57 | 0.55 |
| A4 | 3.16 | 0.53 | 0.51 |

$$0.2\ eV \leq E_{T1}(H) - E_{T1}(FD) \leq 0.5\ eV. \quad \text{Equation 1}$$

Referring to Tables 3 and 4, it is seen that combinations of Compounds A1 to A4 and Compounds 2, 202, and 203 do not satisfy Equation 1. Without wishing to be bound to theory, it is expected that when one selected from Compounds A1 to A4 is used as a host, a manufactured organic light-emitting device may have relatively low efficiency.

Referring to Tables 3 and 4, it is seen that combinations of Compound B1 and each of Compounds H1 to H14 do not satisfy Equation 1. Without wishing to be bound to theory, it is expected that when Compound B1 is used as a dopant, a manufactured organic light-emitting device may have relatively low efficiency.

In various embodiments, the fluorescent dopant may be a thermally activated delayed fluorescence (TADF) dopant that may emit blue light.

An amount of the fluorescent dopant in the emission layer may be in a range of 0.01 to 30 parts by weight based on 100 parts by weight of the host. Without wishing to be bound to theory, it is understood that when the amount of the fluorescent dopant is within this range, a concentration quenching-free and high-quality organic light-emitting device may be obtained.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is suitable for use in general organic light-emitting devices may be used, and the substrate may be a glass substrate or a transparent plastic substrate, each having excellent mechanical strength, thermal stability, transparency, surface smoothness, ease of handling, and water-resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In some embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layer structure or a multi-layer structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In some embodiments, the hole transport region may have a structure of hole injection layer/hole transport layer or hole injection layer/hole transport layer/electron blocking layer, which are sequentially stacked in this stated order from the first electrode 11.

A hole injection layer hole injection layer may be formed on the first electrode 11 by using one or more suitable methods selected from vacuum deposition, spin coating, casting, or Langmuir-Blodgett (LB).

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Angstroms per second (Å/sec). However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (PANI/CSA), (polyaniline)/poly(4-styrenesulfonate) (Pani/PSS), a compound represented by Formula 201 below, and a compound represented by Formula 202 below:

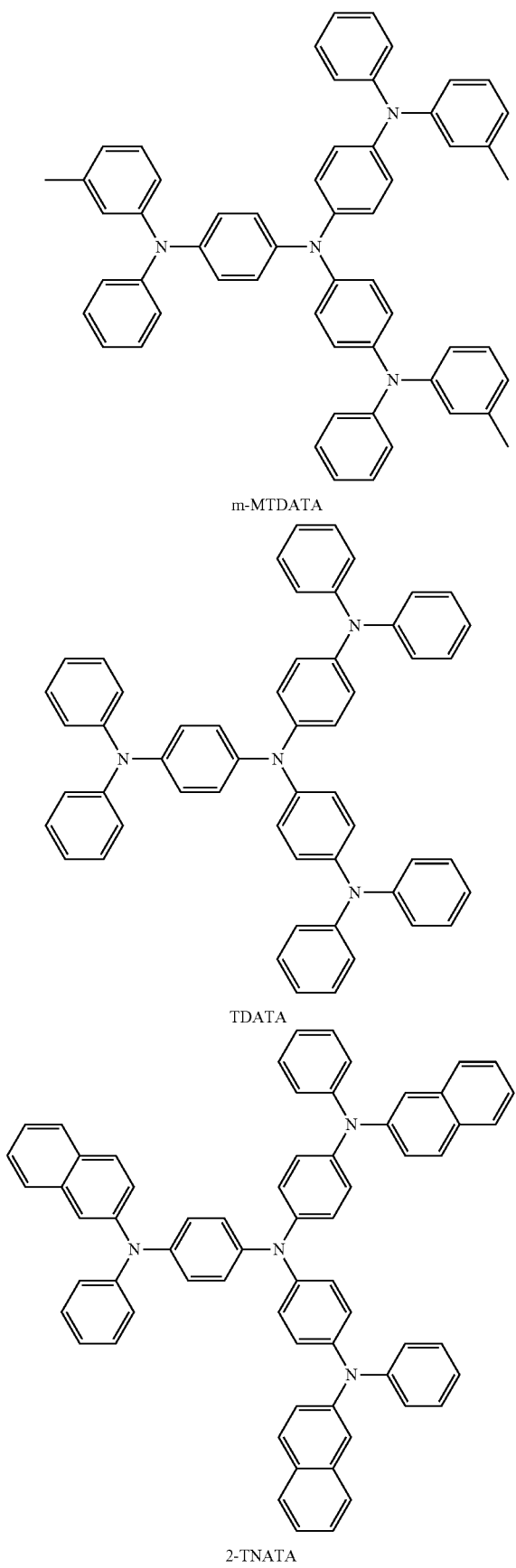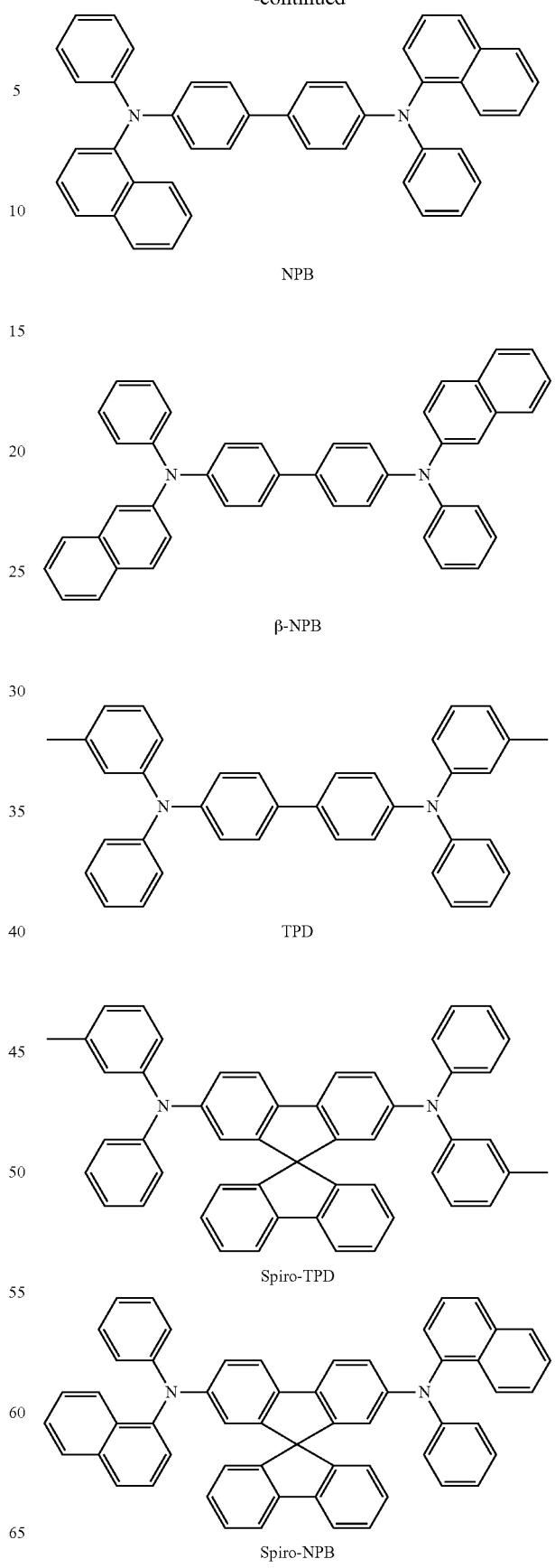

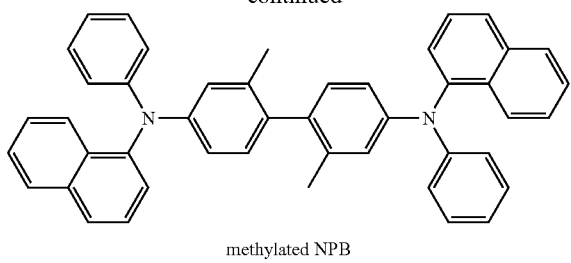

methylated NPB

TAPC

HMTPD

Formula 201

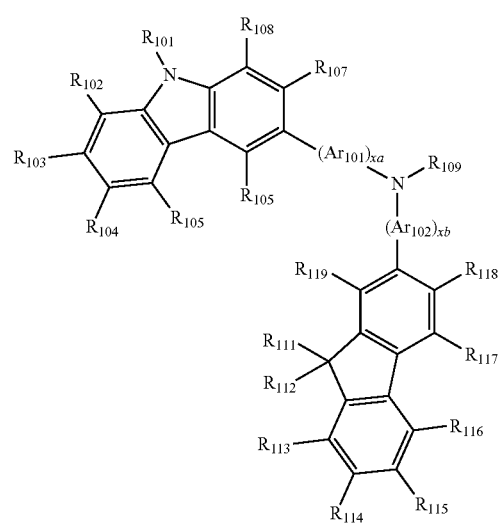

Formula 202

[Formula 202 structure with $R_{121}$, $R_{122}$, $R_{123}$, $R_{124}$ on carbazole-biphenyl-carbazole framework]

$Ar_{101}$ and $Ar_{102}$ in Formula 201 may each independently be selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer selected from 0 to 5, or 0, 1, or 2. For example, xa may be 1 and xb may be 0, but they are not limited thereto.

$R_{101}$ to $R_{108}$, $R_{111}$ to $R_{119}$, and $R_{121}$ to $R_{124}$ in Formulae 201 and 202 may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but embodiments are not limited thereto.

$R_{109}$ in Formula 201 may be a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In an embodiment, the compound represented by Formula 201 may be represented by Formula 201A, but is not limited thereto:

Formula 201A

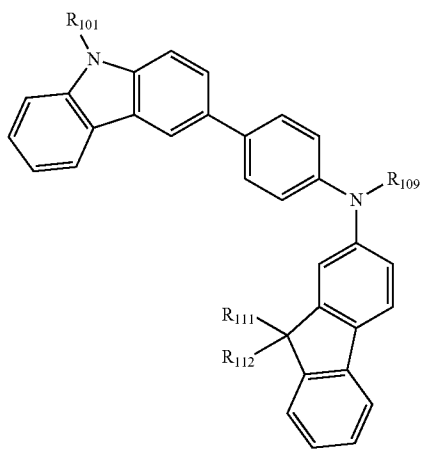

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto.

HT1

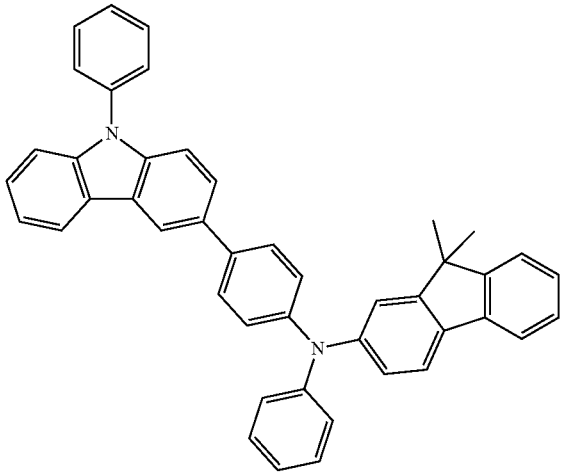

HT2

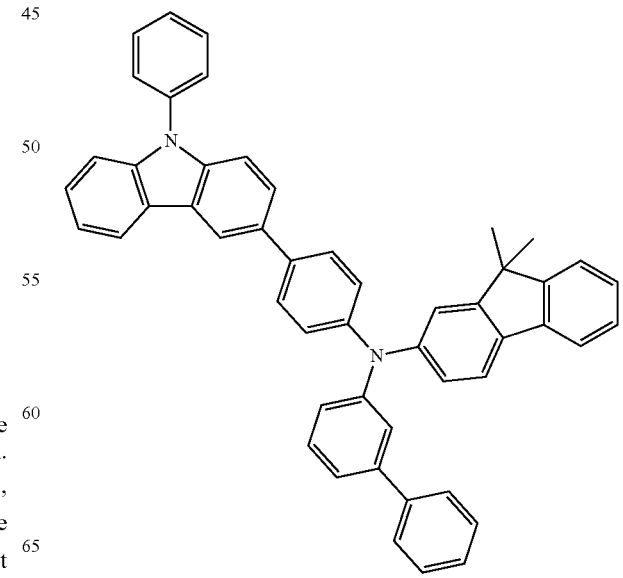

HT3
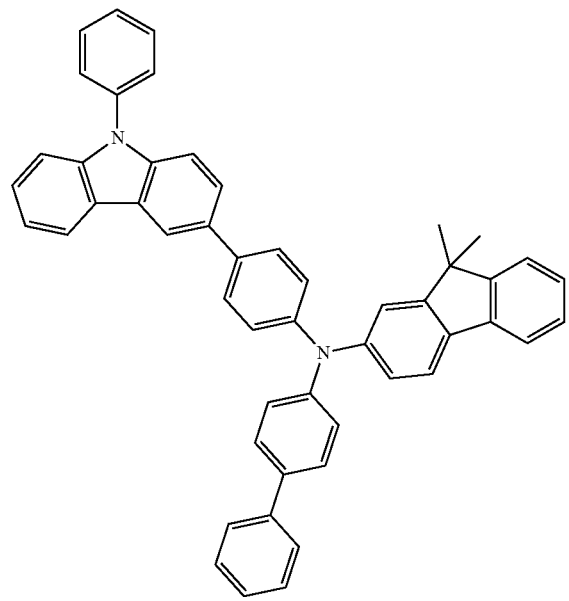
HT5
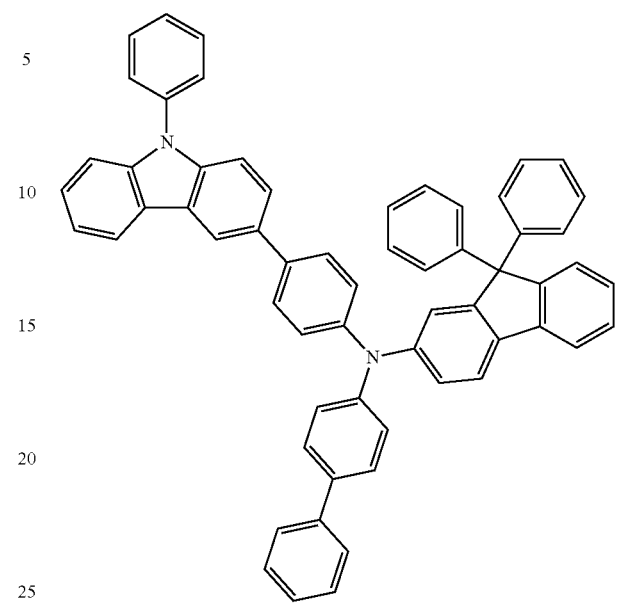
HT4
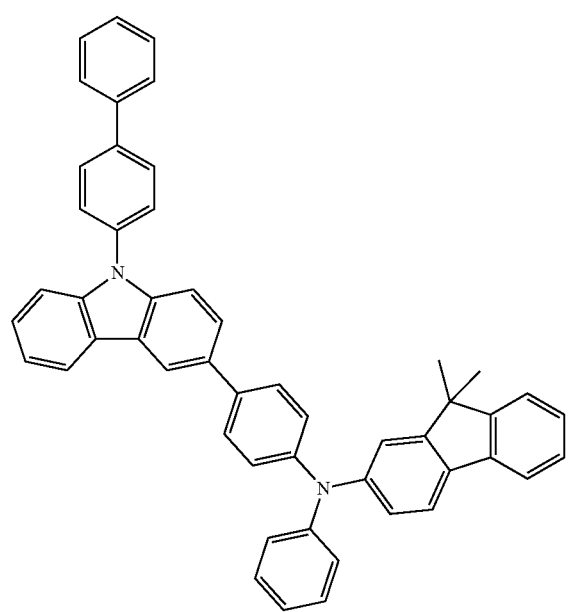
HT6
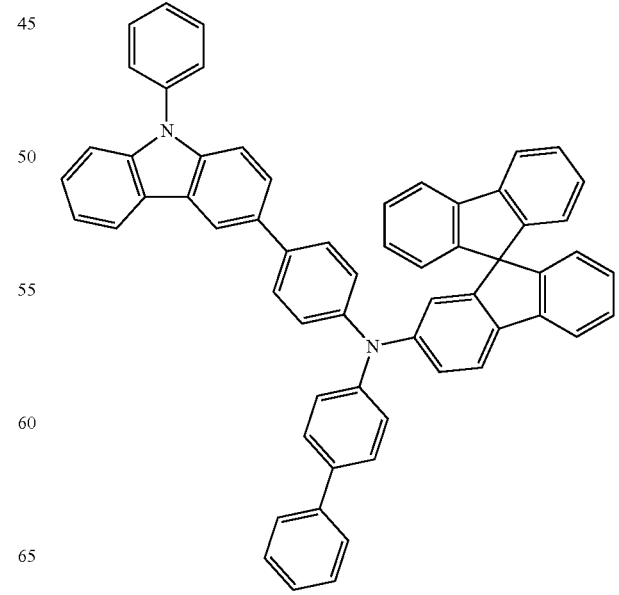

HT7
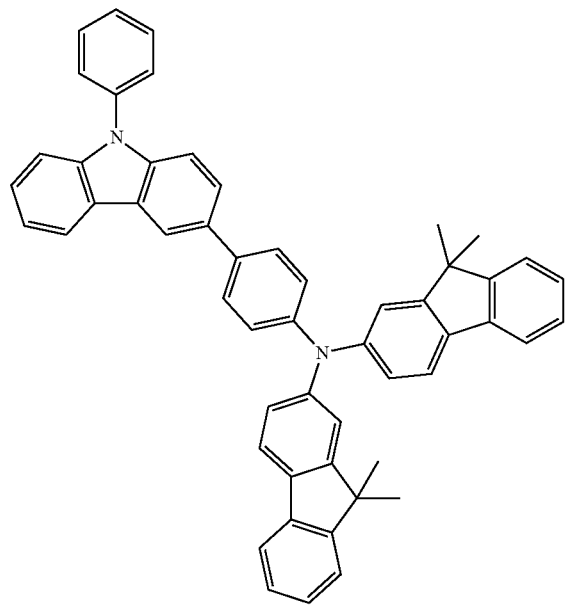
HT8
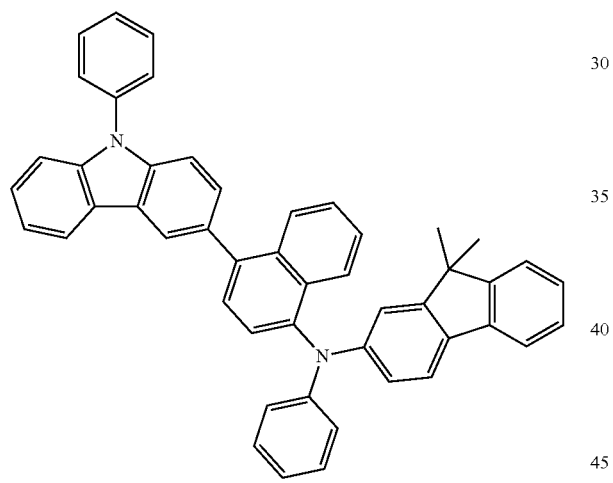
HT9
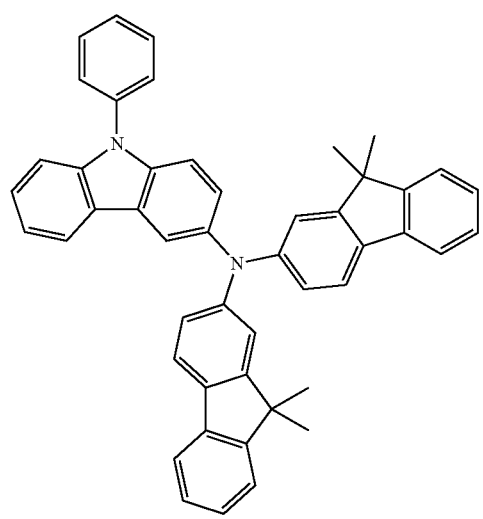
HT10
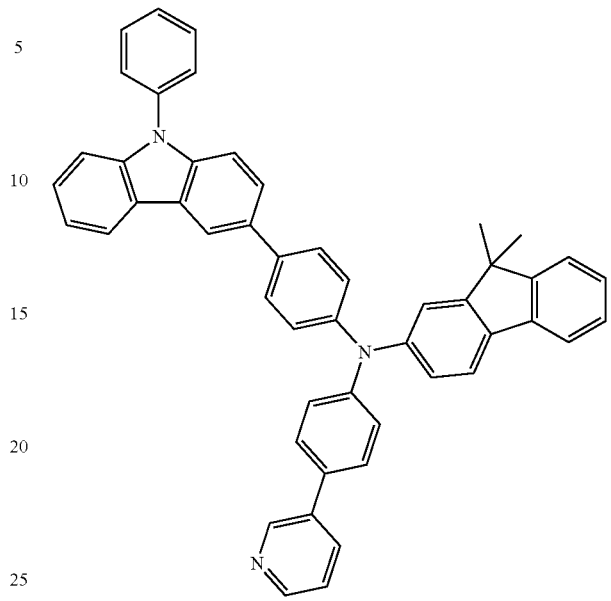
HT11
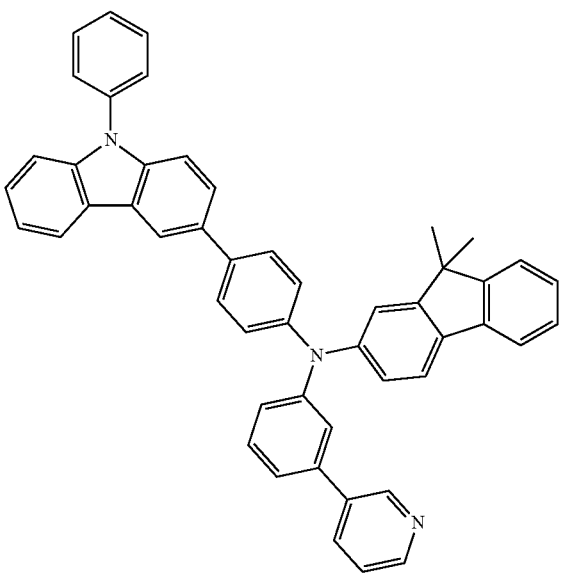

HT12
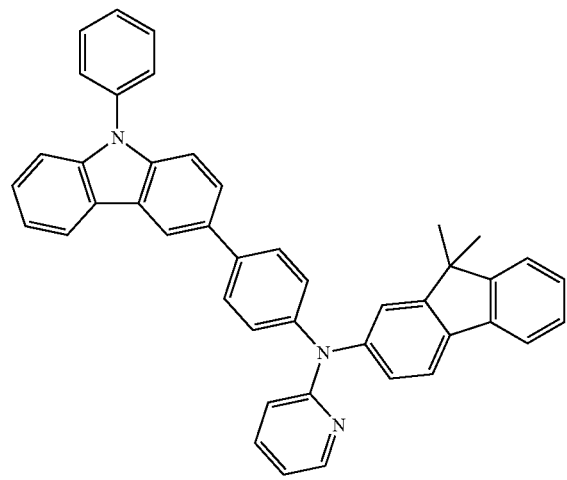
HT13
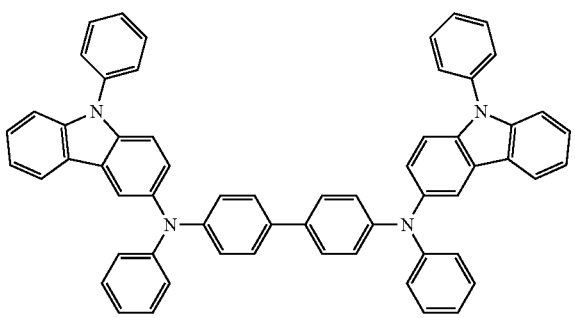
HT14
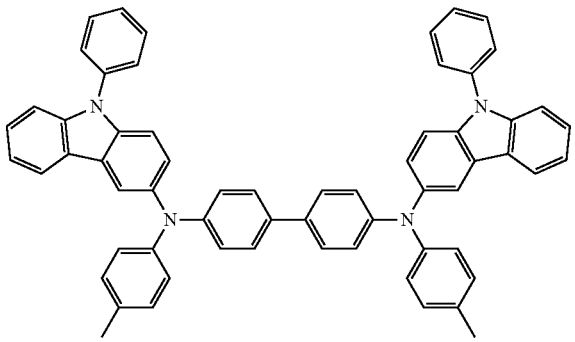
HT15
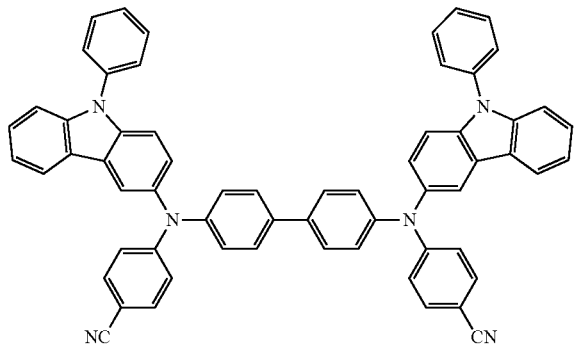
HT16
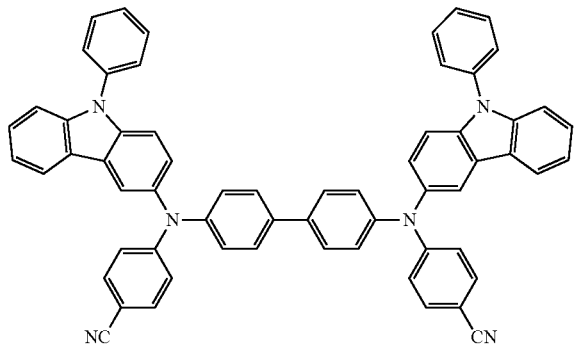
HT17
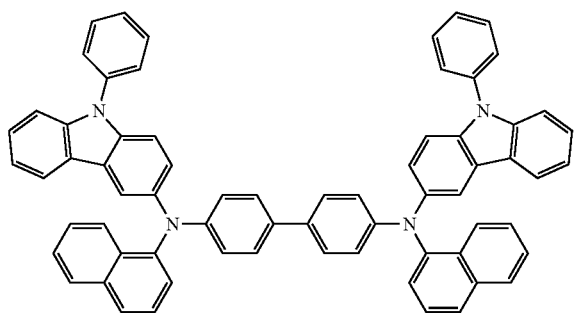
HT18
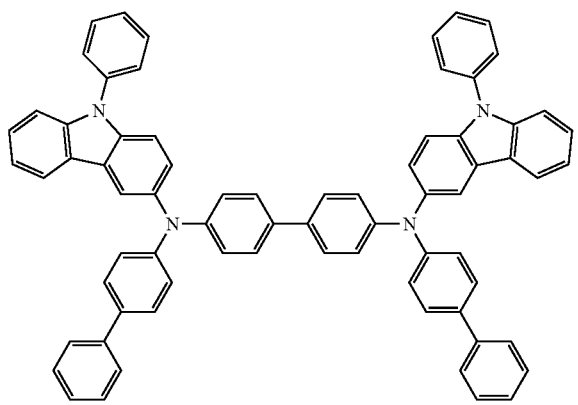
HT19
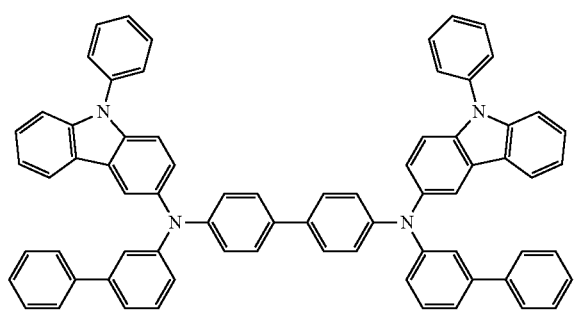

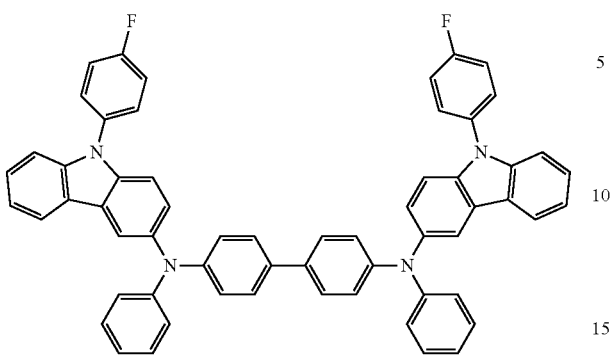

HT20

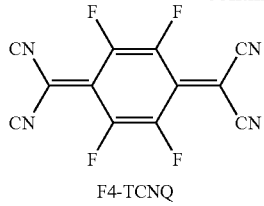

F4-TCNQ

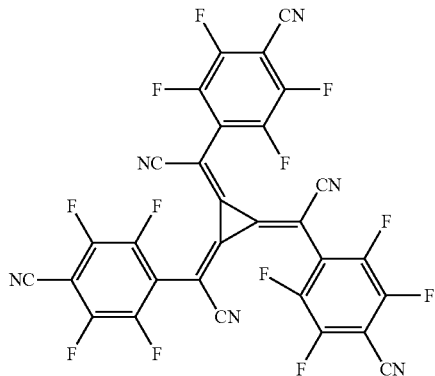

HP-1

A thickness of the hole transport region may be in a range of about 100 Angstroms (Å) to about 10,000 Å, for example, about 100 Å to about 1,000 Å. When the hole transport region includes a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. Without wishing to be bound to theory, it is understood that when the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or HP-1, but are not limited thereto.

Compound HT-D1

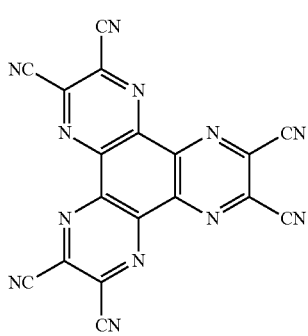

The hole transport region may include a buffer layer.

Also, the buffer layer may compensate for an optical resonance distance according to a wavelength of light emitted from the emission layer, and thus, efficiency of a formed organic light-emitting device may be improved.

The electron transport region may further include an electron blocking layer. The electron blocking layer may include, for example, mCP, but a material therefor is not limited thereto.

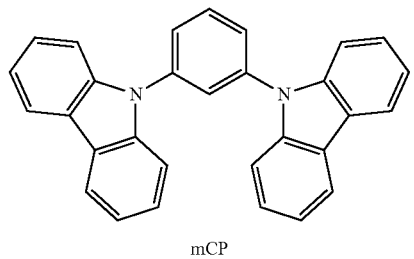 [SMILES: c1cc(-n2c3ccccc3c3ccccc32)cc(-n2c3ccccc3c3ccccc32)c1]

mCP

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied to form the hole injection layer although the deposition or coating conditions may vary according to the material that is used to form the emission layer.

When the organic light-emitting device is a full color organic light-emitting device, the emission layer may be patterned into a red emission layer, a green emission layer, and a blue emission layer. In some embodiments, due to a stack structure including a red emission layer, a green emission layer, and/or a blue emission layer, the emission layer may emit white light.

The emission layer may include a host and a fluorescent dopant, and the host and the fluorescent dopant are substantially the same as described above.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a structure of hole blocking layer/electron transport layer/electron injection layer or a structure of electron transport layer/electron injection layer, but the structure of the electron transport region is not limited thereto. The electron transport layer may have a single-layered structure or a multi-layer structure including two or more different materials.

Conditions for forming the hole blocking layer, the electron transport layer, and the electron injection layer which constitute the electron transport region may be understood by referring to the conditions for forming the hole injection layer.

When the electron transport layer includes a hole blocking layer, the hole blocking layer may include, for example, at least one of BCP and Bphen, but may also include other materials:

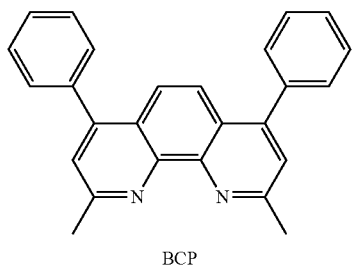

BCP

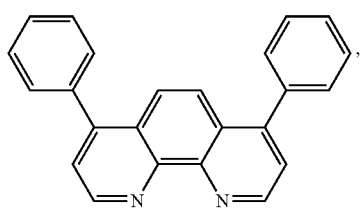

Bphen

A thickness of the hole blocking layer may be in a range of about 20 Å to about 1,000 Å, for example, about 30 Å to about 300 Å. Without wishing to be bound to theory, it is understood that when the thickness of the hole blocking layer is within these ranges, the hole blocking layer may have improved hole blocking ability without a substantial increase in driving voltage.

The electron transport layer may further include at least one selected from BCP, Bphen, Alq$_3$, Balq, TAZ, and NTAZ.

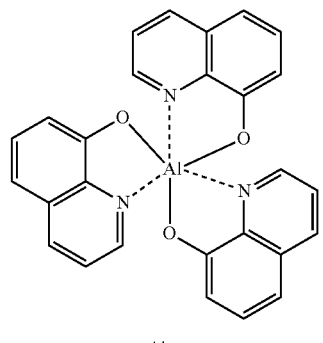

Alq$_3$

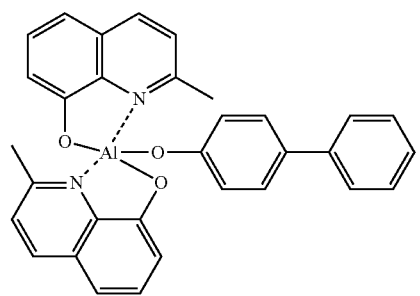

BAlq

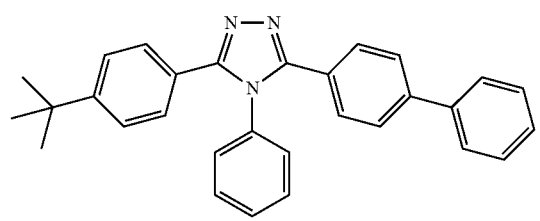

TAZ

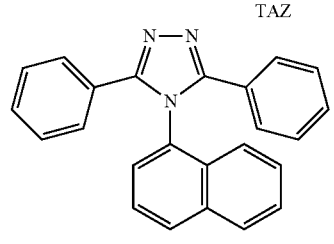

NTAZ

In some embodiments, the electron transport layer may include at least one selected from Compounds ET1, ET2, and ET3, but embodiments are not limited thereto:

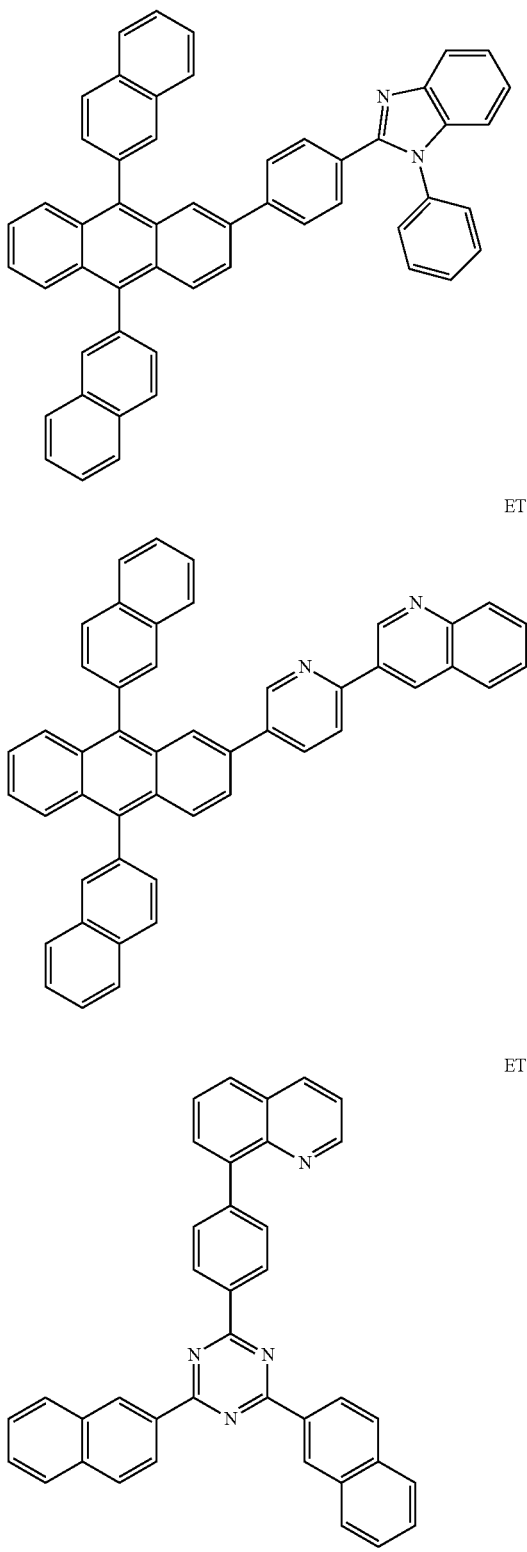

ET1

ET2

ET3

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

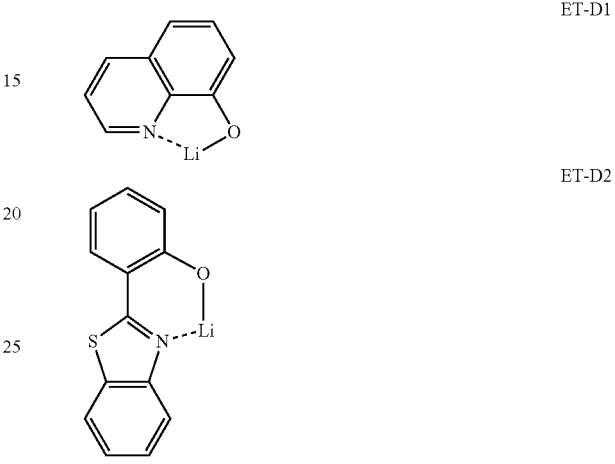

ET-D1

ET-D2

The electron transport layer may include an electron injection layer (EIL) that promotes flow of electrons from the second electrode 19 thereinto.

The electron injection layer may include at least one selected from, LiF, NaCl, CsF, $Li_2O$, BaO, and LiQ.

A thickness of the electron injection layer may be in a range of about 1 Å to about 100 Å, about 3 Å to about 90 Å. Without wishing to be bound to theory, it is understood that when the thickness of the electron injection layer is within the range described above, the electron injection layer may have satisfactory electron injection characteristics without a substantial increase in driving voltage.

The second electrode 19 may be disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as a material for forming the second electrode 19. In some embodiments, to manufacture a top emission type light-emitting device, a transmissive electrode formed using ITO or IZO may be used as the second electrode 19.

Hereinbefore, the organic light-emitting device has been described with reference to FIG. 1, but is not limited thereto.

The term "$C_1$-$C_{60}$ alkyl group," as used herein, refers to a linear or branched aliphatic hydrocarbon monovalent group having 1 to 60 carbon atoms. Non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group," as used herein, refers to a divalent group having the same structure as the $C_1$-$C_{60}$ alkyl group.

The term "$C_1$-$C_{60}$ alkoxy group," as used herein, refers to a monovalent group represented by —$OA_{101}$ (wherein $A_{101}$ is the $C_1$-$C_{60}$ alkyl group). Non-limiting examples thereof include a methoxy group, an ethoxy group, and an isopropyloxy group.

The term "$C_2$-$C_{60}$ alkenyl group," as used herein, refers to a hydrocarbon group formed by including at least one carbon double bond in the middle or at the terminal of the $C_2$-$C_{60}$ alkyl group. Examples thereof are an ethenyl group, a propenyl group, and a butenyl group. The term "$C_2$-$C_{60}$ alkenylene group," as used herein, refers to a divalent group having the same structure as the $C_2$-$C_{60}$ alkenyl group.

The term "$C_2$-$C_{60}$ alkynyl group," as used herein, refers to a hydrocarbon group formed by placing at least one carbon triple bond in the middle or at the terminal of the $C_2$-$C_{60}$ alkyl group. Examples thereof are an ethynyl group, and a propynyl group. The term "$C_2$-$C_{60}$ alkynylene group," as used herein, refers to a divalent group having the same structure as the $C_2$-$C_{60}$ alkynyl group.

The term "$C_3$-$C_{10}$ cycloalkyl group," as used herein, refers to a monovalent hydrocarbon monocyclic group having 3 to 10 carbon atoms. Non-limiting examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having the same structure as the $C_3$-$C_{10}$ cycloalkyl group.

The term "$C_2$-$C_{10}$ heterocycloalkyl group," as used herein, refers to a monovalent monocyclic group having at least one heteroatom selected from N, O, P, Si and S as a ring-forming atom and 2 to 10 carbon atoms. Non-limiting examples thereof include a tetrahydrofuranyl group and a tetrahydrothiophenyl group. The term "$C_2$-$C_{10}$ heterocycloalkylene group," as used herein, refers to a divalent group having the same structure as the $C_2$-$C_{10}$ heterocycloalkyl group.

The term "$C_3$-$C_{10}$ cycloalkenyl group," as used herein, refers to a monovalent monocyclic group that has 3 to 10 carbon atoms and at least one double bond in the ring thereof, and which is not aromatic. Non-limiting examples thereof include a cyclopentenyl group, a cyclohexenyl group, and a cycloheptenyl group. The term "$C_3$-$C_{10}$ cycloalkenylene group," as used herein, refers to a divalent group having the same structure as the $C_3$-$C_{10}$ cycloalkenyl group.

The term "$C_2$-$C_{10}$ heterocycloalkenyl group," as used herein, refers to a monovalent monocyclic group that has at least one heteroatom selected from N, O, P, Si, and S as a ring-forming atom, 2 to 10 carbon atoms, and at least one double bond in its ring. Non-limiting examples of the $C_2$-$C_{10}$ heterocycloalkenyl group include a 2,3-dihydrofuranyl group and a 2,3-dihydrothiophenyl group. The term "$C_2$-$C_{10}$ heterocycloalkenylene group," as used herein, refers to a divalent group having the same structure as the $C_2$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_2$-$C_{60}$ heteroaryl group," as used herein, refers to a monovalent group having a carbocyclic aromatic system that has at least one heteroatom selected from N, O, P, Si, and S as a ring-forming atom, and 2 to 60 carbon atoms. The term "$C_2$-$C_{60}$ heteroarylene group," as used herein refers to a divalent group having a carbocyclic aromatic system that has at least one heteroatom selected from N, O, P, Si, and S as a ring-forming atom, and 2 to 60 carbon atoms. Non-limiting examples of the $C_2$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group each include two or more rings, the rings may be fused to each other.

The term "$C_6$-$C_{60}$ aryloxy group," as used herein, refers to —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

The term "monovalent non-aromatic condensed polycyclic group," as used herein, refers to a monovalent group that has two or more rings condensed to each other, only carbon atoms (for example, the number of carbon atoms may be in a range of 8 to 60) as a ring forming atom, and which is non-aromatic in the entire molecular structure. Non-limiting examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group," as used herein, refers to a monovalent group that has two or more rings condensed to each other, has a heteroatom selected from N, O, P, Si, and S, other than carbon atoms (for example, the number of carbon atoms may be in a range of 2 to 60), as a ring forming atom, and which is non-aromatic in the entire molecular structure. Non-limiting examples of the monovalent non-aromatic condensed heteropolycyclic group include a carbazolyl group. The term "divalent non-aromatic condensed heteropolycyclic group," as used herein, refers to a divalent group having the same structure as the monovalent non-aromatic condensed heteropolycyclic group.

At least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ may each independently be selected from hydrogen, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{60}$ alkyl" refers to a $C_1$-$C_{60}$ alkyl group substituted with $C_6$-$C_{60}$ aryl group, the total number of carbon atoms in the resulting aryl substituted alkyl group is $C_7$-$C_{120}$.

The term "room temperature," as used herein, refers to the temperature of about 25° C.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLE

Comparative Example 1

A glass substrate with a 1,500 Å-thick ITO (Indium tin oxide) electrode (first electrode, anode) formed thereon was washed with distilled water and ultrasonic waves. When the washing with distilled water was completed, sonification washing was performed thereon using a solvent, such as isopropyl alcohol, acetone, or methanol. The result was dried and then transferred to a plasma washer, and the resultant substrate was washed with oxygen plasma for 5 minutes and transferred to a vacuum depositing device.

Compound HT3 and Compound HP-1 were co-deposited on the ITO electrode on the glass substrate to form a hole injection layer having a thickness of 100 Å. Compound HT3 was deposited on the hole injection layer to form a hole transport layer having a thickness of 1,350 Å, and mCP was subsequently deposited on the hole transport layer to form an electron blocking layer having a thickness of 100 Å, thereby completing the manufacture of a hole transport region.

On the hole transport region, Compound A1 (host) and Compound 2 (fluorescent dopant) were co-deposited at a volumetric ratio of 85:15 to form an emission layer having a thickness of 300 Å.

Compound BCP was vacuum-deposited on the emission layer to form a hole blocking layer having a thickness of 100 Å. Compound ET3 and Liq were vacuum deposited together on the hole blocking layer to form an electron transport layer having a thickness of 300 Å, and Liq was subsequently deposited on the electron transport layer to form an electron injection layer having a thickness of 10 Å. Al second electrode (cathode) having a thickness of 1,000 Å was formed on the electron injection layer to complete manufacturing of an organic light-emitting device.

Comparative Examples 2 to 3 and Examples 1 and 2

Organic light-emitting devices were manufactured in the same manner as in Example 1, except that the emission layer was formed by using materials shown in Table 5.

Evaluation Example 1

Evaluation on Data about Organic Light-emitting Devices

A driving voltage, a current density, a luminance, a maximum emission wavelength, a color coordinate, a power efficiency, and a lifespan ($T_{95}$) of the organic light-emitting devices manufactured according to Comparative Examples 1 to 3 and Examples 1 and 2 were measured by using a current-voltage meter (Keithley 2400) and a luminance meter (Minolta Cs-1000A). Results thereof are shown in Table 5. $T_{95}$ (at 500 candelas per square meter, cd/m²) data in Table 5 indicates an amount of time (hour, hr) that lapsed when 100% of the initial luminance was decreased to 95%.

TABLE 5
| Example No. | Host | Fluorescent dopant | Driving voltage (V) | Luminance (cd/m²) | Maximum emission wavelength (nm) | CIEx | CIEy | Power efficiency (lm/W at 500 cd/m²) | Lifespan (T₉₅) at 500 cd/m² |
|---|---|---|---|---|---|---|---|---|---|
| Comparative Example 1 | A1 | 2 | 6.4 | 500 | 484 | 0.215 | 0.350 | 17.6 | 0.1 |
| Comparative Example 2 | A2 | 2 | 6.3 | 500 | 468 | 0.192 | 0.296 | 11.2 | 0.07 |
| Comparative Example 3 | A3 | 2 | 6.4 | 500 | 468 | 0.193 | 0.293 | 9.2 | 0.06 |
| Example 1 | H1 | 2 | 5.4 | 500 | 472 | 0.204 | 0.322 | 16.9 | 2.3 |
| Example 2 | H8 | 2 | 4.7 | 500 | 476 | 0.209 | 0.340 | 20.4 | 3.4 |
A1
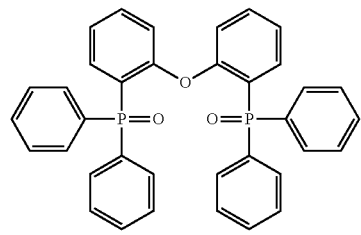 [SMILES: O=P(c1ccccc1)(c1ccccc1)c1ccccc1Oc1ccccc1P(=O)(c1ccccc1)c1ccccc1]
A2
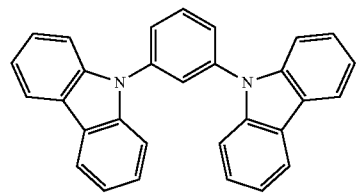 [SMILES: c1cc(-n2c3ccccc3c3ccccc32)cc(-n2c3ccccc3c3ccccc32)c1]
A3
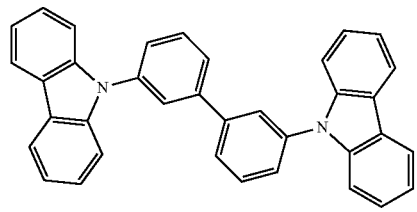 [SMILES: c1cc(-c2cccc(-n3c4ccccc4c4ccccc43)c2)cc(-n2c3ccccc3c3ccccc32)c1]
H1
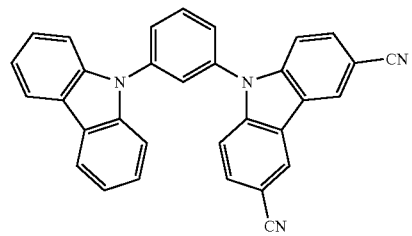 [SMILES: N#Cc1ccc2c(c1)c1cc(C#N)ccc1n2-c1cccc(-n2c3ccccc3c3ccccc32)c1]
H8
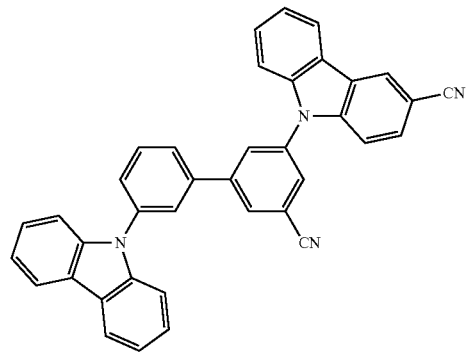 [SMILES: N#Cc1cc(-c2cccc(-n3c4ccccc4c4ccccc43)c2)cc(-n2c3ccccc3c3cc(C#N)ccc32)c1]

TABLE 5-continued

| Example No. | Host | Fluorescent dopant | Driving voltage (V) | Luminance (cd/m$^2$) | Maximum emission wavelength (nm) | CIEx | CIEy | Power efficiency (lm/W at 500 cd/m$^2$) | Lifespan ($T_{95}$) at 500 cd/m$^2$ |
|---|---|---|---|---|---|---|---|---|---|
| 2 | | | | | | | | | |

(structure shown)

Referring to Table 5, it is seen that the organic light-emitting devices manufactured according to Examples 1 and 2 have lower driving voltage, higher power efficiency, and/or longer lifespan than the organic light-emitting devices manufactured according to Comparative Examples 1 to 3.

Comparative Examples 4 to 6 and Examples 3

Organic light-emitting devices were manufactured in the same manner as in Example 1, except that the emission layer was formed by using materials shown in Table 6.

Evaluation Example 2

Evaluation on Data about Organic Light-emitting Devices

A driving voltage, a current density, a luminance, a maximum emission wavelength, a color coordinate, an external quantum efficiency (EQE), a power efficiency, luminescent efficiency, and a lifespan ($T_{95}$) of the organic light-emitting devices manufactured according to Comparative Examples 4 to 6 and Example 3 were measured by using a current-voltage meter (Keithley 2400) and a luminance meter (Minolta Cs-1000A). Results thereof are shown in Tables 6 and 7. $T_{95}$ (at 500 cd/m$^2$) data in Table 7 indicates an amount of time (hr) that lapsed when 100% of the initial luminance was decreased to 95%.

TABLE 6

| Example No. | Host | Fluorescent dopant | Driving voltage (V) | Luminance (cd/m$^2$) | Maximum emission wavelength (nm) | CIEx | CIEy | EQE (%) at 500 cd/m$^2$ | EQE (%) Maximum value |
|---|---|---|---|---|---|---|---|---|---|
| Comparative Example 4 | A1 | | 201 | 1.95 | 500 | 488 | 0.221 | 0.389 | 10.3 | 10.5 |
| Comparative Example 5 | A2 | | 201 | 3.12 | 500 | 484 | 0.208 | 0.372 | 6.8 | 8.2 |
| Comparative Example 6 | A4 | | 201 | 2.35 | 500 | 488 | 0.224 | 0.410 | 8.4 | 10.5 |
| Example 3 | H1 | | 201 | 1.49 | 500 | 192 | 0.242 | 0.440 | 12.7 | 14.3 |

TABLE 7

| Example No. | Host | Fluorescent dopant | Power efficiency (lm/W at 500 cd/m$^2$) | Luminescent efficiency (cd/A) at 500 cd/m$^2$ | Luminescent efficiency (cd/A) Maximum value | Lifespan ($T_{95}$) at 500 cd/m$^2$ |
|---|---|---|---|---|---|---|
| Comparative Example 4 | A1 | 201 | 12.86 | 25.69 | 26.2 | 0.01 |
| Comparative Example 5 | A2 | 201 | 8.56 | 16.10 | 19.6 | 0.05 |
| Comparative Example 6 | A4 | 201 | 10.84 | 21.32 | 26.5 | 0.04 |
| Example 3 | H1 | 201 | 20.98 | 33.71 | 38.3 | 0.07 |

A1

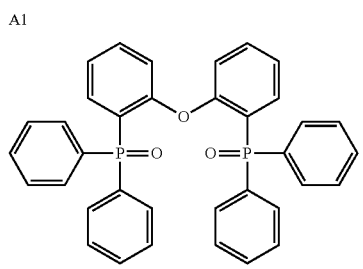

TABLE 7-continued

| Example No. | Host | Fluorescent dopant | Power efficiency (lm/W) at 500 cd/m² | Luminescent efficiency (cd/A) at 500 cd/m² | Luminescent efficiency (cd/A) Maximum value | Lifespan (T₉₅) at 500 cd/m² |
|---|---|---|---|---|---|---|

A2

A4

H1

201

Referring to Tables 6 and 7, it is seen that the organic light-emitting devices manufactured according to Example 3 have improved driving voltage, EQE, power efficiency, luminescent efficiency, and lifespan characteristics, compared to the organic light-emitting devices manufactured according to Comparative Examples 4 to 6.

An organic light-emitting device according to embodiments may have high efficiency and a long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organic light-emitting device comprising:
a first electrode,
a second electrode facing the first electrode, and
an organic layer disposed between the first electrode and the second electrode, wherein
the organic layer comprises an emission layer,
the emission layer comprises a host and a delayed fluorescent dopant, wherein the delayed fluorescent dopant is a thermally activated delayed fluorescence (TADF) dopant,
the organic light-emitting device satisfies Equation 1,
the host comprises a compound represented by Formulae 1, 2, or 3, and
the delayed fluorescent dopant satisfies Equation 2:

$$0.2 \text{ electron Volts} \leq E_{T1}(H) - E_{T1}(FD) \leq 0.5 \text{ electron Volts} \quad \text{Equation 1}$$

$$0 \text{ electron Volts} \leq E_{S1}(FD) - E_{T1}(FD) \leq 0.2 \text{ electron Volts}, \quad \text{Equation 2}$$

wherein in Equation 1 and 2, $E_{T1}(H)$ is a triplet energy level of the host expressed in electron Volts, $E_{T1}(FD)$ is a triplet energy level of the delayed fluorescent dopant expressed in electron Volts, $E_{S1}(FD)$ is a singlet energy level of the delayed fluorescent dopant expressed in electron Volts, and $E_{T1}(H)$, $E_{T1}(FD)$, and $E_{S1}(FD)$ are evaluated by using a Density Functional Theory method of Gaussian program that is structurally optimized at a level of B3LYP/6-31G(d,p):

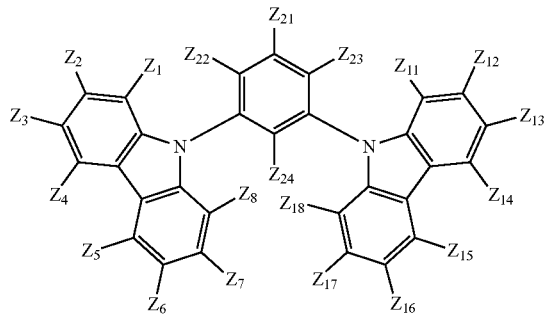

Formula 1

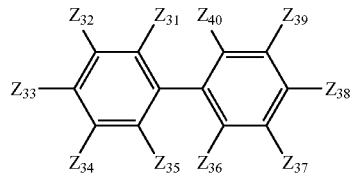

Formula 2

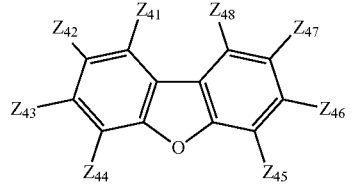

Formula 3

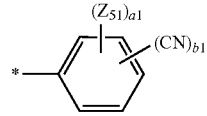

Formula 2A

-continued

Formula 2B

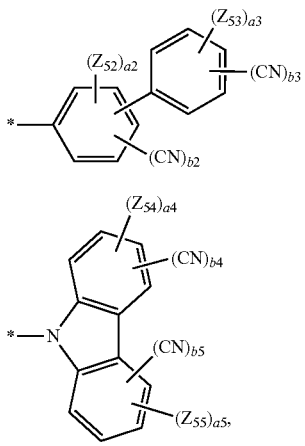

Formula 2C wherein $Z_1$ to $Z_8$ and $Z_{11}$ to $Z_{18}$ in Formula 1 are each independently selected from hydrogen, deuterium, and a cyano group (CN), $Z_{21}$ to $Z_{24}$ in Formula 1 are each independently selected from hydrogen, deuterium, a cyano group, a group represented by Formula 2A, and a group represented by Formula 2B, $Z_{31}$ to $Z_{40}$ in Formula 2 and $Z_{41}$ to $Z_{48}$ in Formula 3 are each independently selected from hydrogen, deuterium, a cyano group, and a group represented by Formula 2C, wherein at least two selected from $Z_{31}$ to $Z_{40}$ in Formula 2 and at least two selected from $Z_{41}$ to $Z_{48}$ in Formula 3 are each independently selected from groups represented by Formula 2C, $Z_{51}$ to $Z_{55}$ in Formulae 2A to 2C are each independently hydrogen or deuterium, a1 to a5 in Formulae 2A to 2C are each independently an integer selected from 0 to 4, b1 in Formula 2A is an integer selected from 1 to 5, b2 to b5 in Formulae 2B and 2C are each independently an integer selected from 0 to 4, provided that the sum of b2 and b3 is 1 or more,

* in Formulae 2A to 2C indicates a binding site to a neighboring atom, and the compound represented by Formula 1, the compound represented by Formula 2, and the compound represented by Formula 3 each independently comprise at least one cyano group, wherein the delayed fluorescent dopant is a compound represented by Formula 11 or 14A:

Formula 11

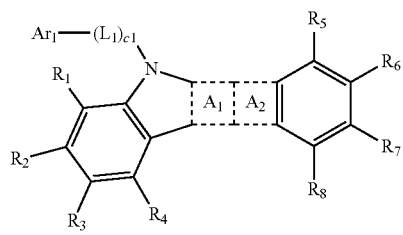

Formula 12A

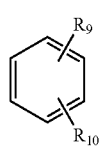

-continued

Formula 12B

wherein ring $A_1$ in Formula 11 is a group represented by Formula 12A, ring $A_2$ in Formula 11 is a group represented by Formula 12B, $X_1$ in Formula 12B is O, or S, $L_1$ and $L_2$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, c1 and c2 are each independently an integer selected from 0 to 4, $Ar_1$ and $Ar_2$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_1$ to $R_{10}$ are each independently selected from hydrogen, deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), and —B($Q_6$)($Q_7$), and at least one substituent selected from the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, a substituted divalent non-aromatic condensed polycyclic group, a substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted heteroaryl group, a substituted monovalent non-aromatic condensed polycyclic group and a substituted monovalent non-aromatic condensed heteropolycyclic group is selected from deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ are each independently selected from hydrogen, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group,

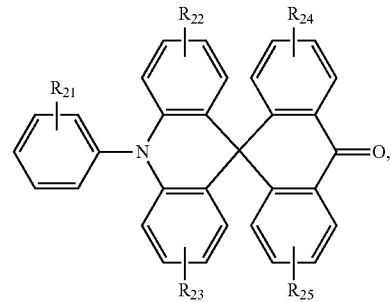

Formula 14A wherein $R_{21}$ to $R_{25}$ in Formula 14A are each independently selected from hydrogen, deuterium, a cyano group, a $C_1$-$C_{10}$ alkyl group, a phenyl group, a biphenyl group, or a terphenyl group.

2. The organic light-emitting device of claim 1, wherein the delayed fluorescent dopant is selected from Compounds 22 to 39, 61 to 78, and 201:

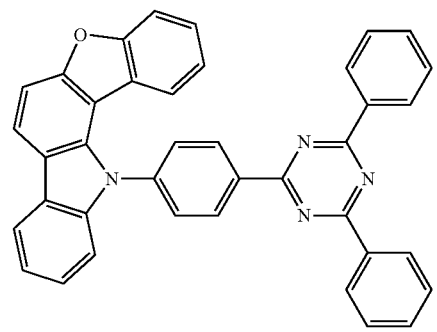

22

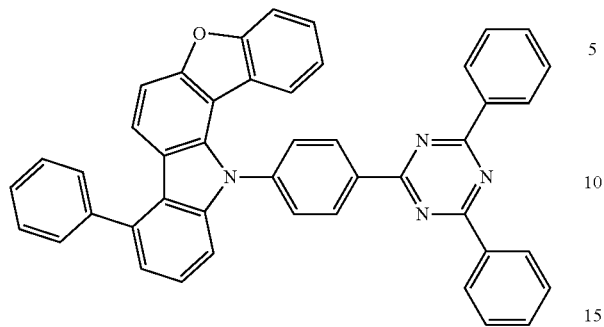
23
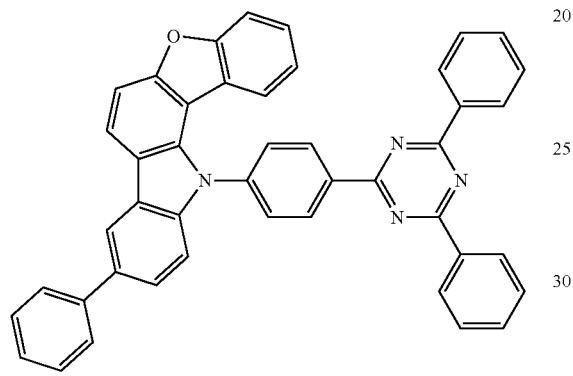
24
25
26
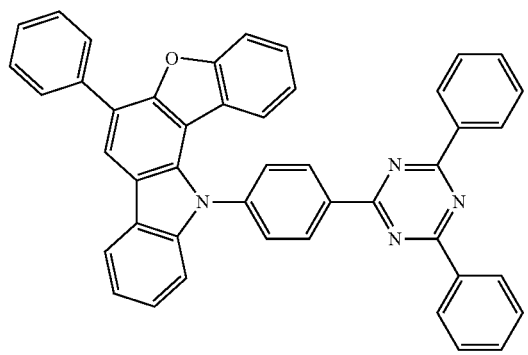
27
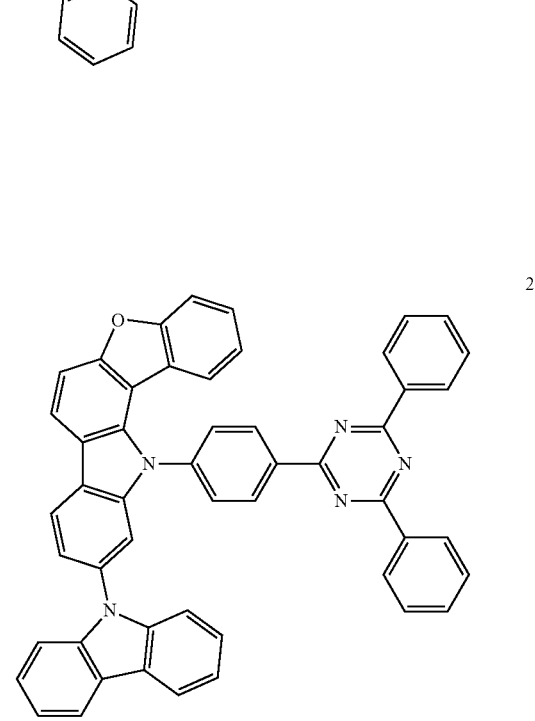
28
29

30
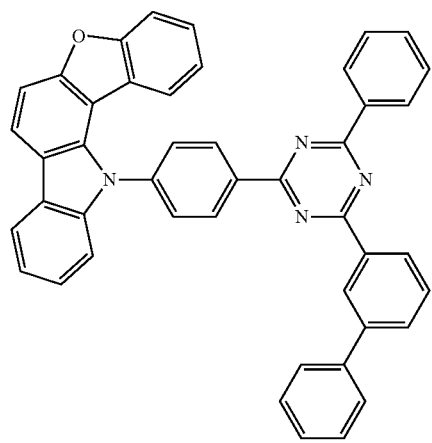
31
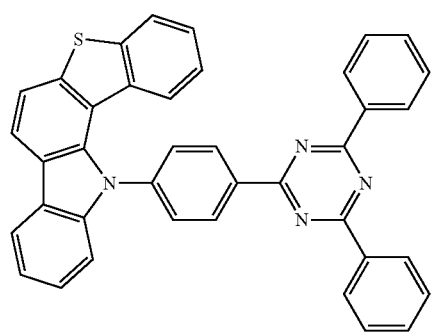
32
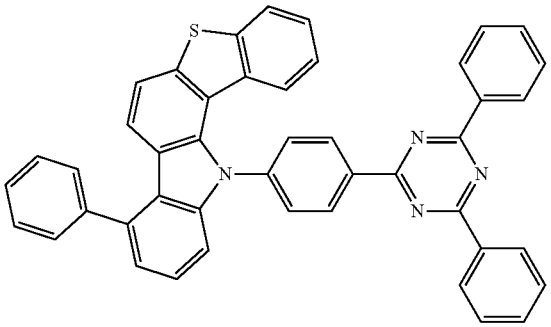
33
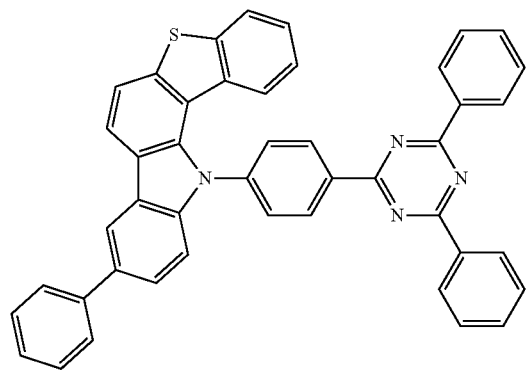
34
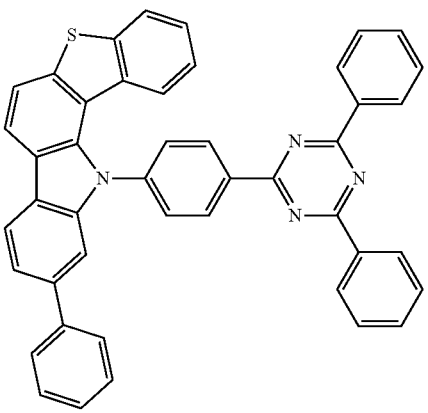
35
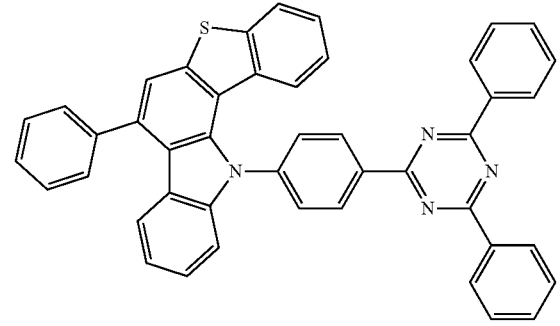
36
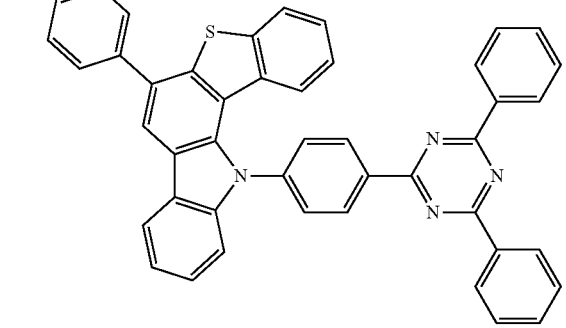
37
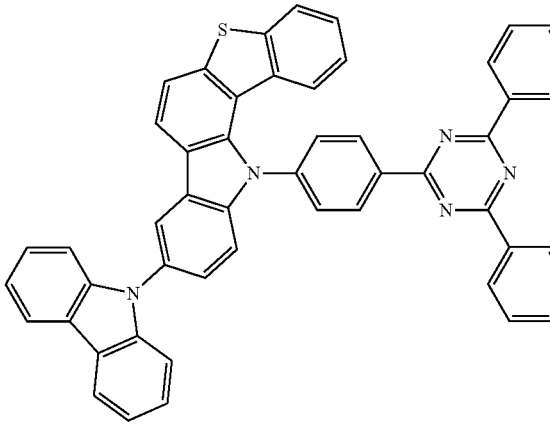

38
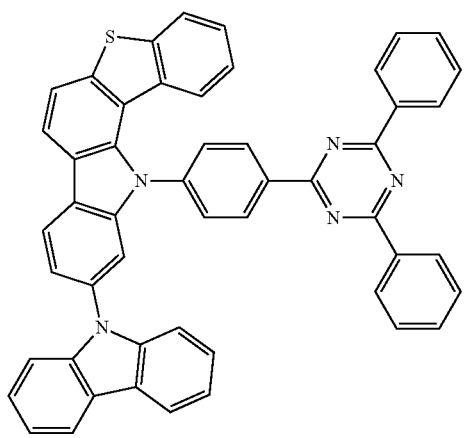
39
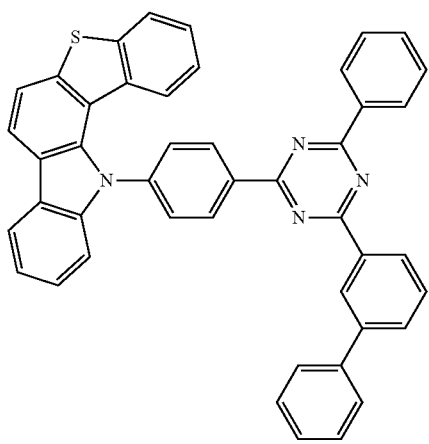
61
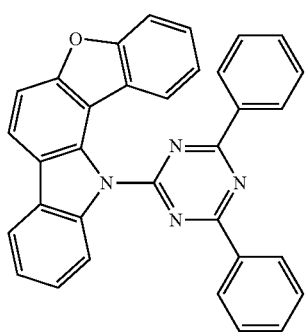
62
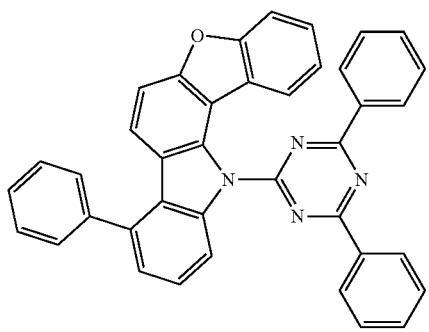
63
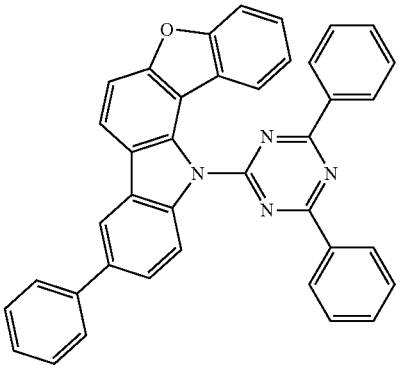
64
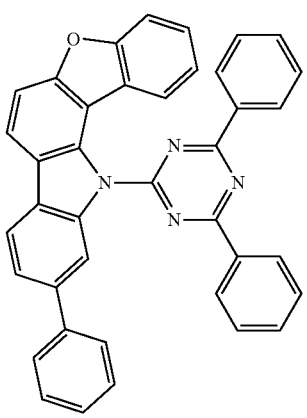
65
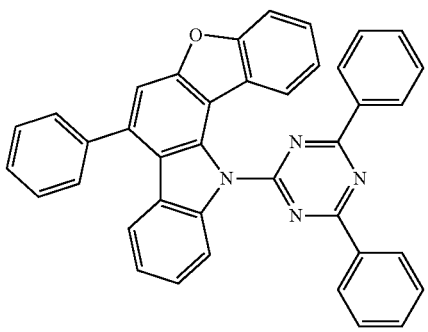
66
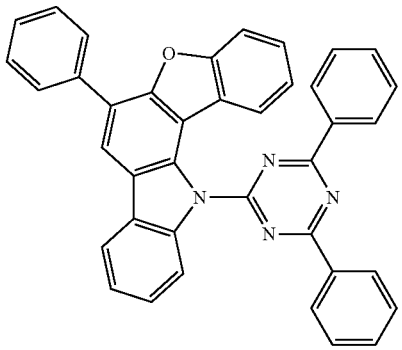

67 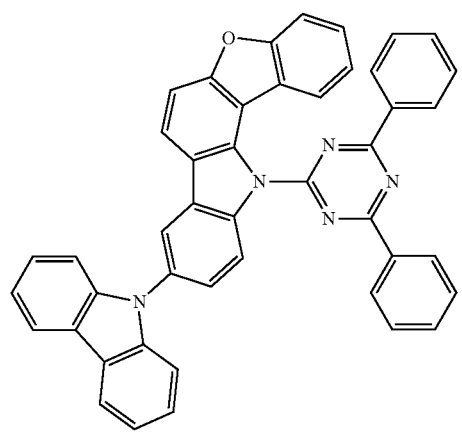
68 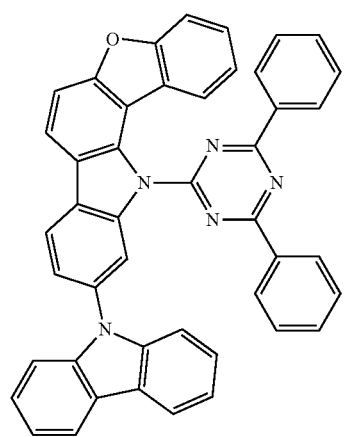
69 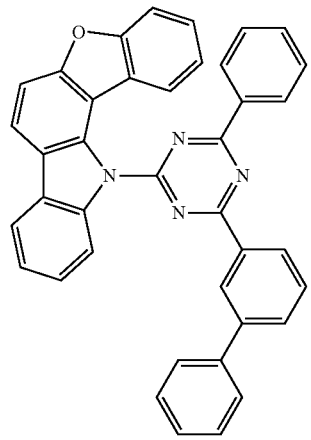
70 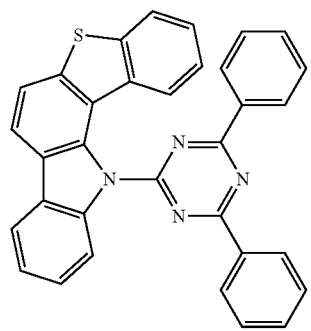
71 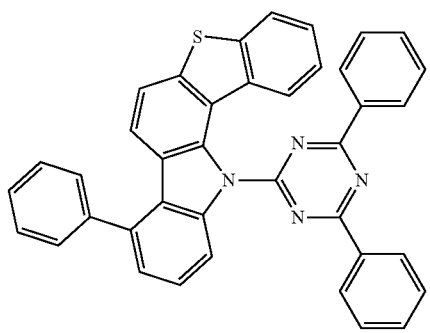
72 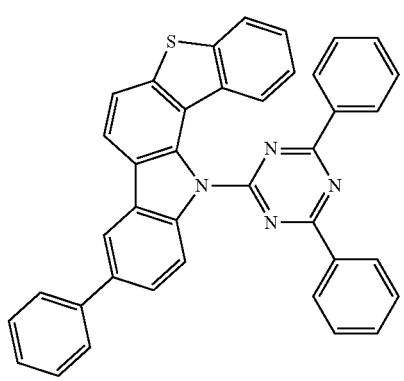
73 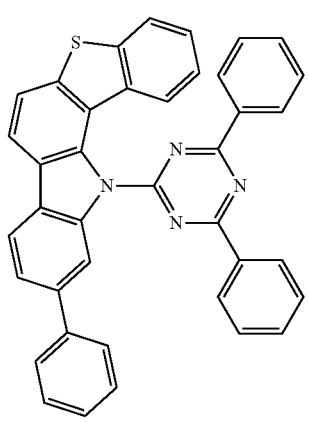

93
-continued
74
75
76
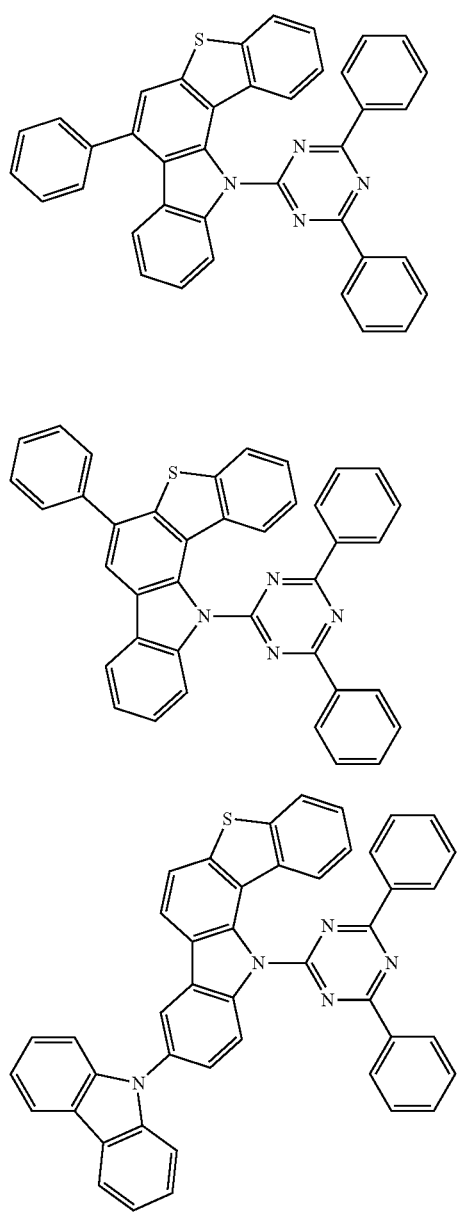
94
-continued
77
78
201
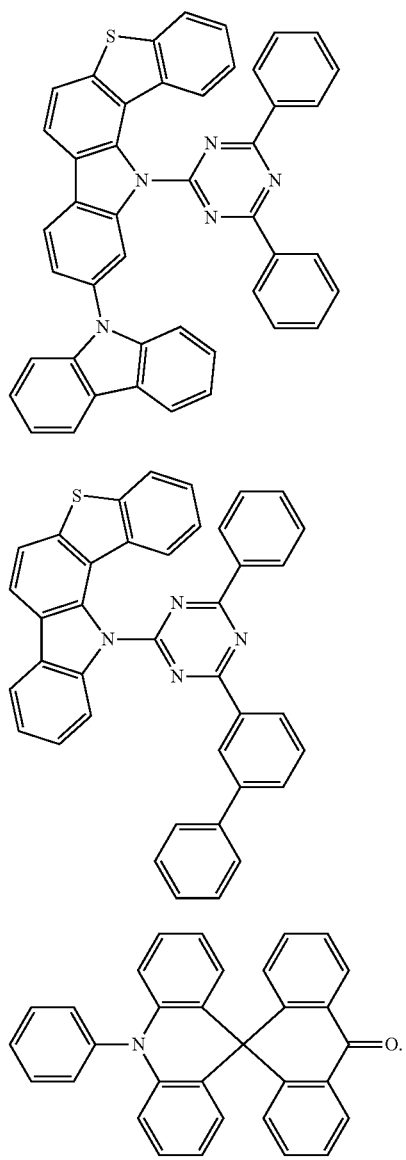
* * * * *